United States Patent [19]

Heiart et al.

[11] Patent Number: 4,527,890
[45] Date of Patent: Jul. 9, 1985

[54] AUTOMATIC REPETITIVE REGISTRATION AND IMAGEWISE EXPOSURE OF SHEET SUBSTRATES

[75] Inventors: Robert B. Heiart, Middletown; Abraham B. Cohen, Springfield, both of N.J.

[73] Assignee: E. I. Du Pont de Nemours and Company, Wilmington, Del.

[21] Appl. No.: 523,357

[22] Filed: Aug. 15, 1983

Related U.S. Application Data

[62] Division of Ser. No. 387,534, Jun. 11, 1982.

[51] Int. Cl.³ .............................................. G03B 27/30
[52] U.S. Cl. ..................................... 355/100; 355/102
[58] Field of Search .................. 355/78, 79, 85–87, 355/91, 99, 100, 102; 430/396; 156/345

[56] References Cited

U.S. PATENT DOCUMENTS

| | | | |
|---|---|---|---|
| 3,547,730 | 12/1970 | Cohen et al. | 156/345 |
| 3,573,975 | 4/1971 | Dhaka et al. | 117/212 |
| 4,087,182 | 5/1978 | Aiba et al. | 355/85 X |
| 4,201,581 | 5/1980 | Thomas et al. | 430/396 |
| 4,281,922 | 8/1981 | Matsumoto | 355/99 |
| 4,423,955 | 1/1984 | Powers | 355/99 |

FOREIGN PATENT DOCUMENTS 48-29727  9/1973  Japan .

OTHER PUBLICATIONS

Tokyo Ohka Kogyo Co., Ltd., YN 2000, Sep. 1981, Japan.

Primary Examiner—Richard A. Wintercorn

[57] ABSTRACT

Apparatus for registering and imagewise exposing to actinic radiation a sequence of similar sheet substrates employing liquid applicator means to allow a photomask to contact a photosensitive layer on the substrate through a liquid.

24 Claims, 24 Drawing Figures

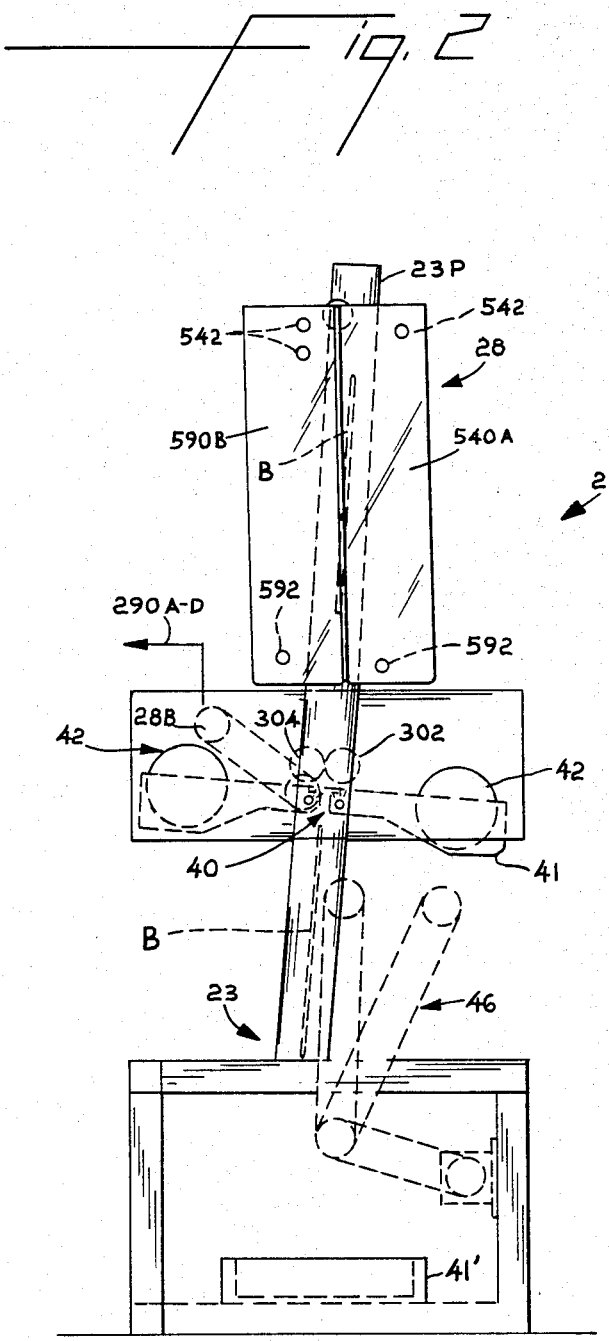

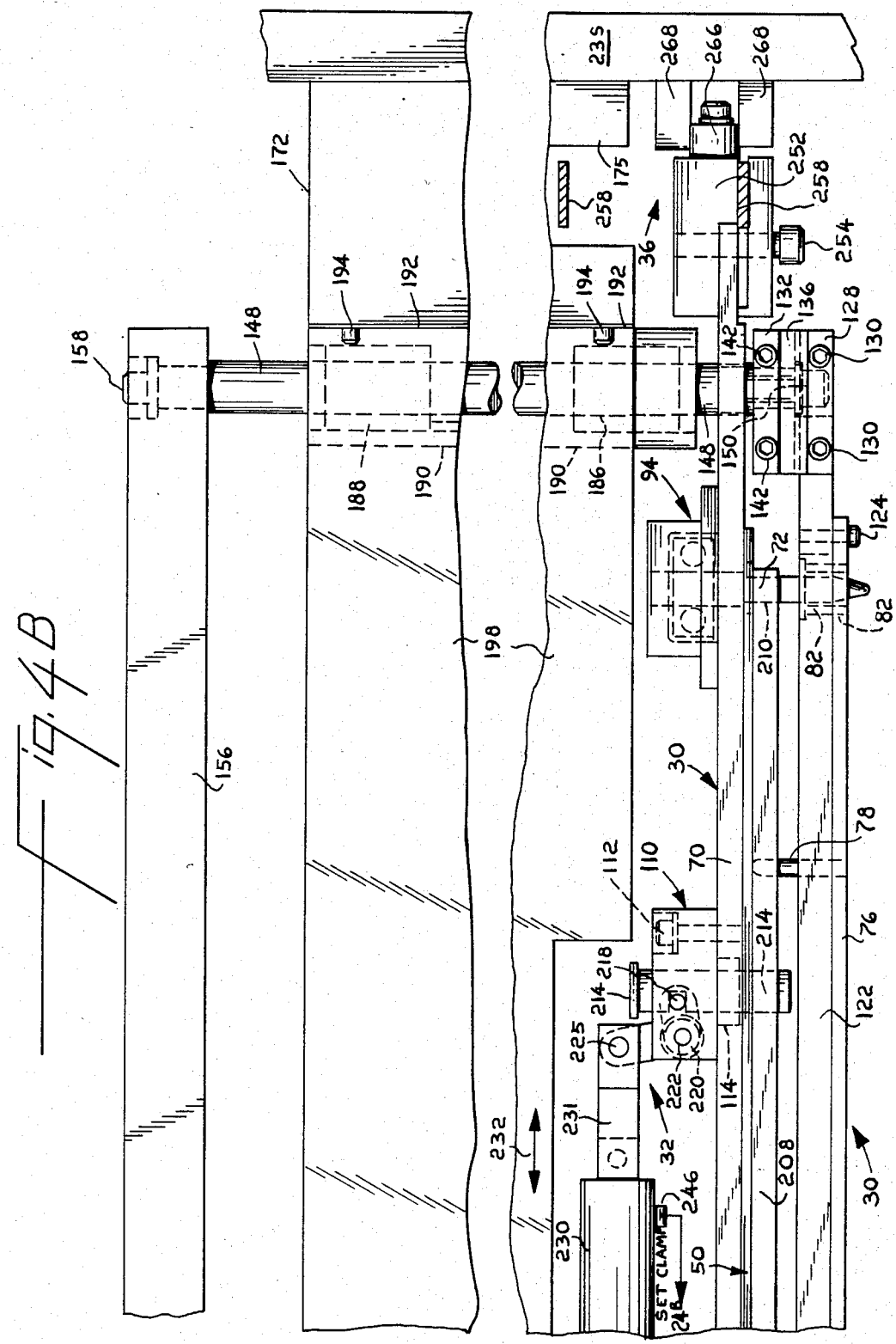

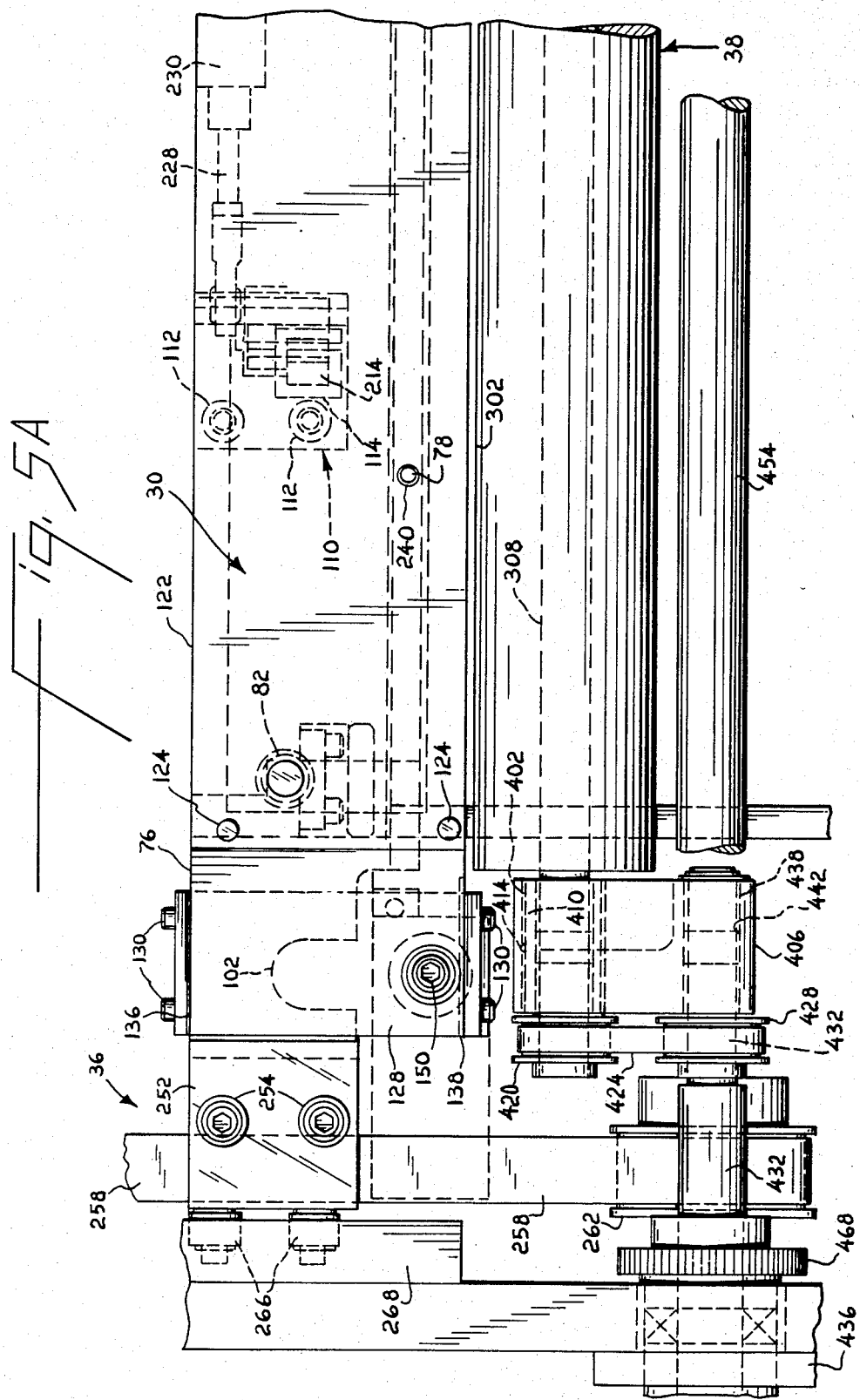

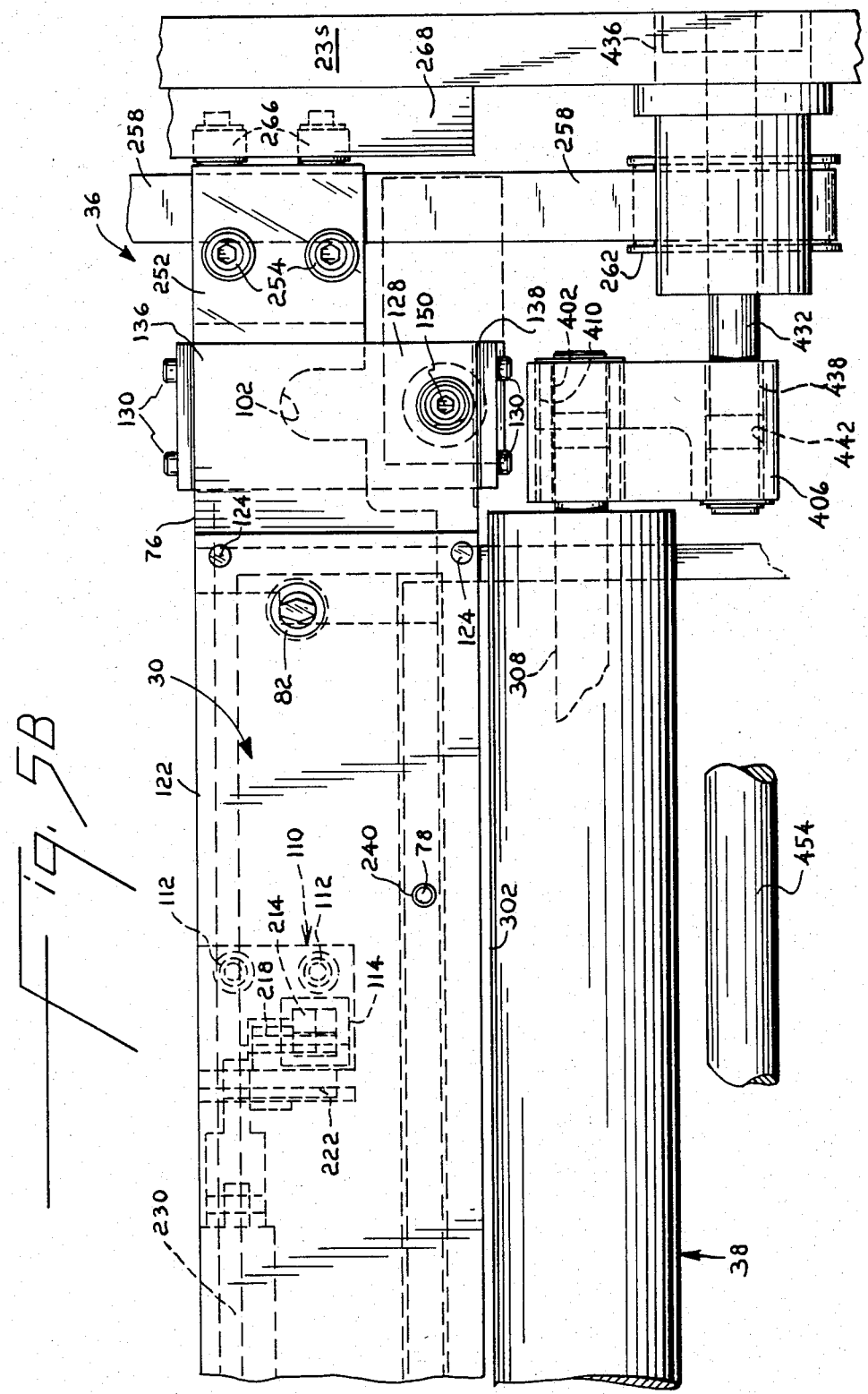

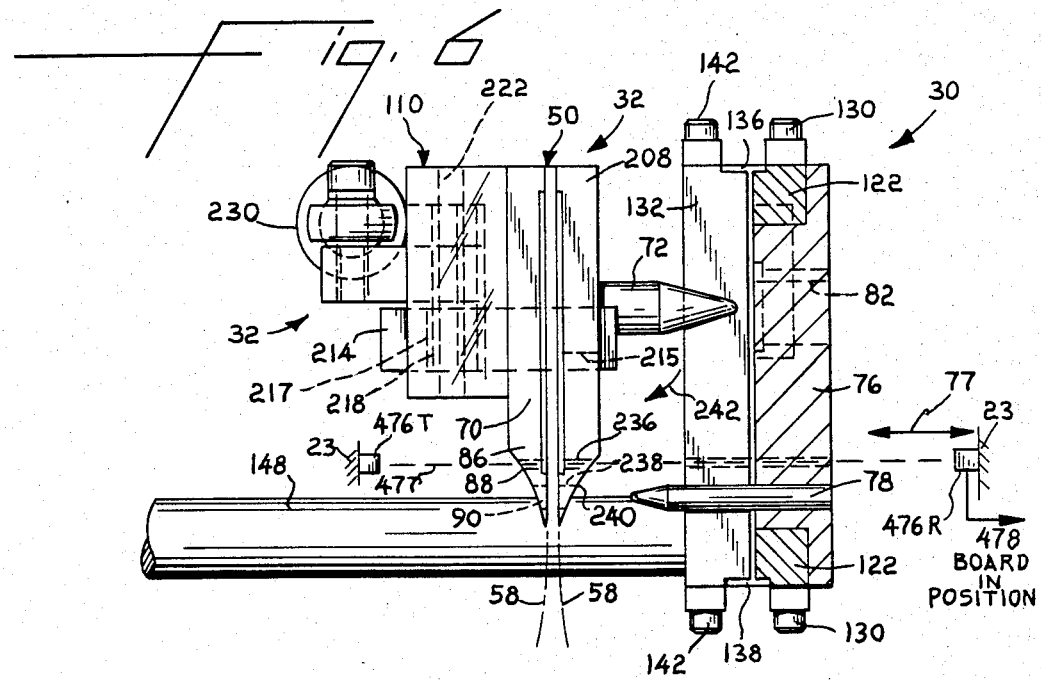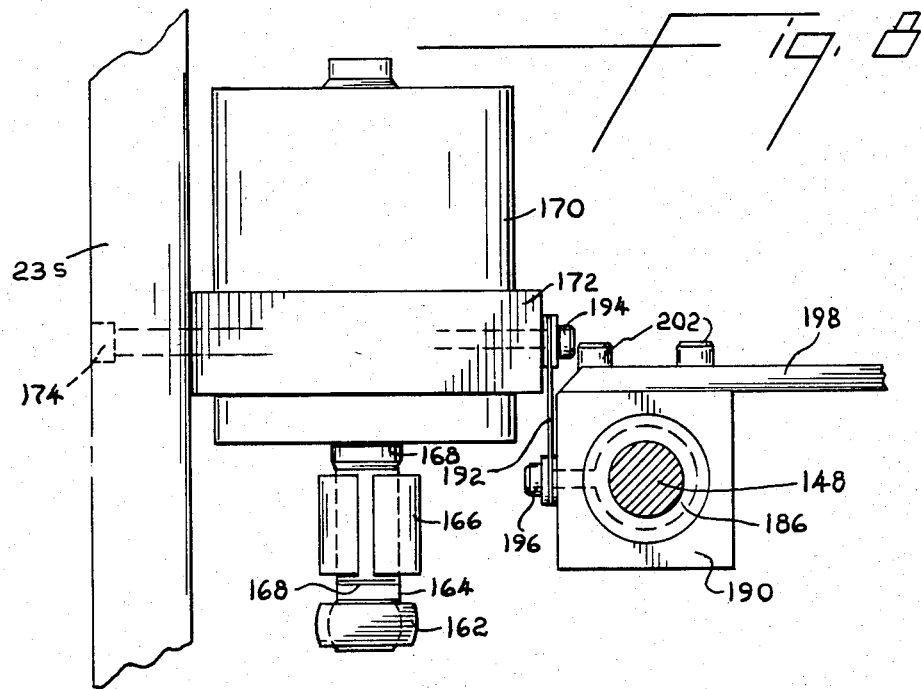

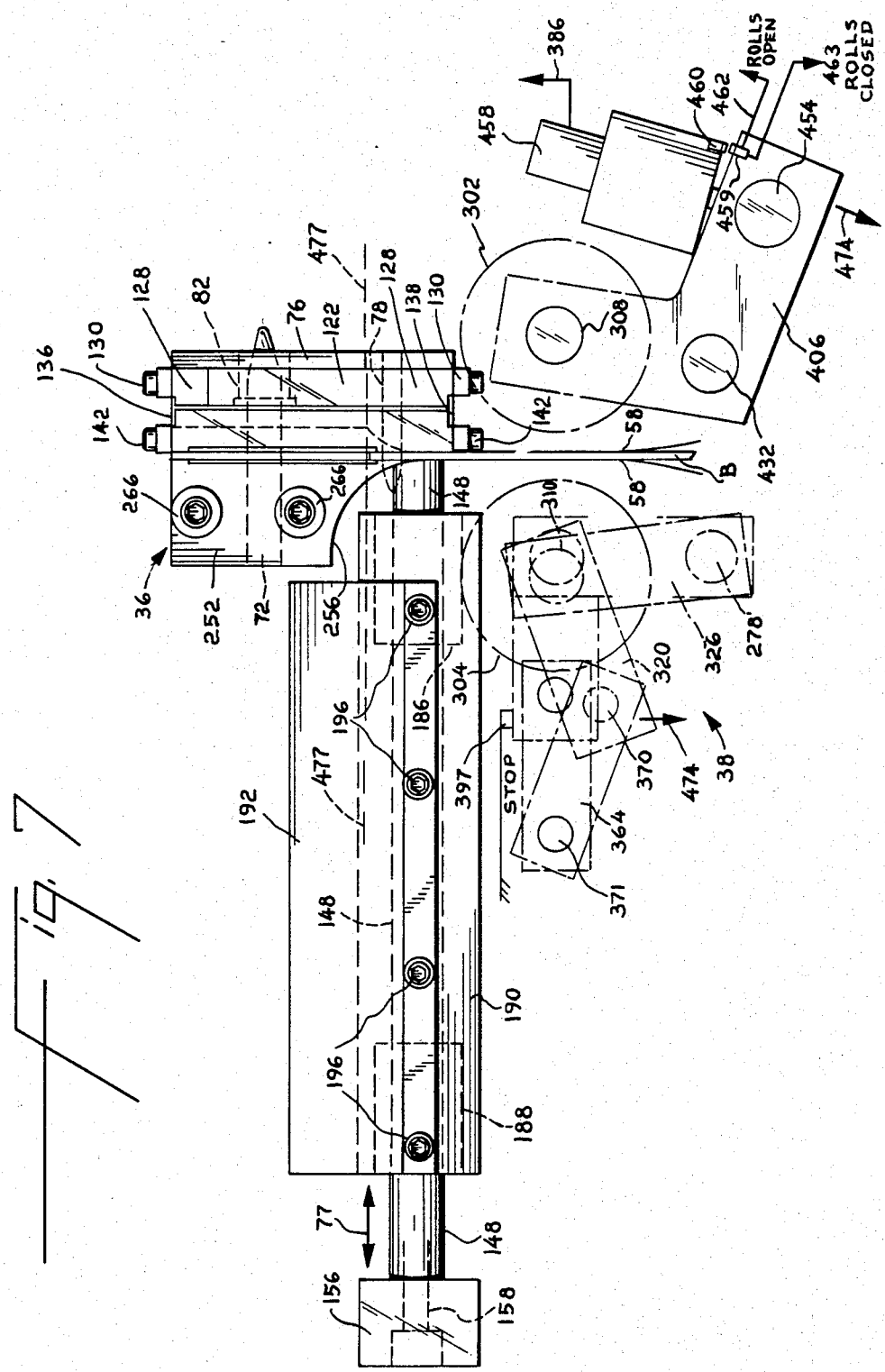

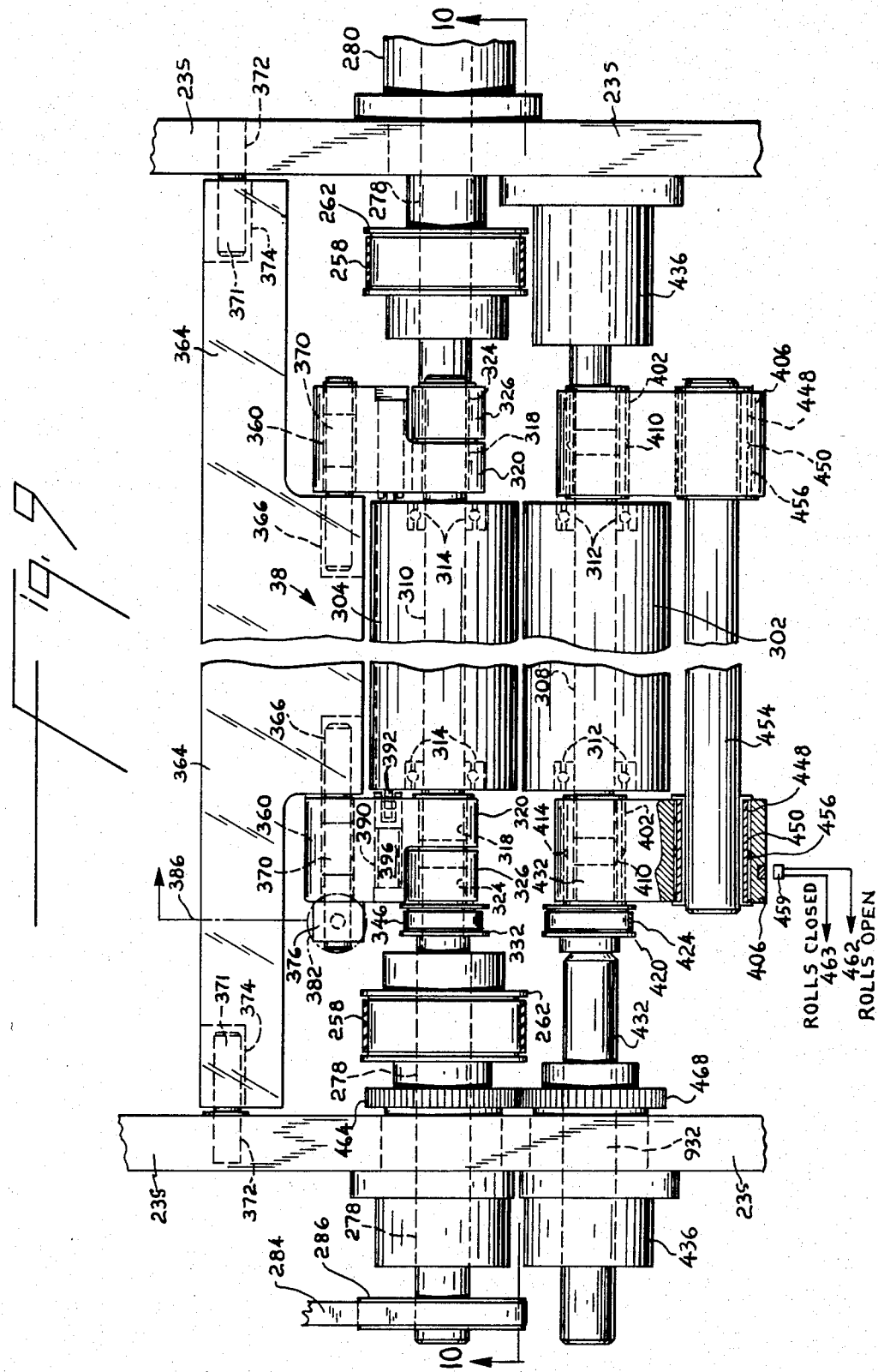

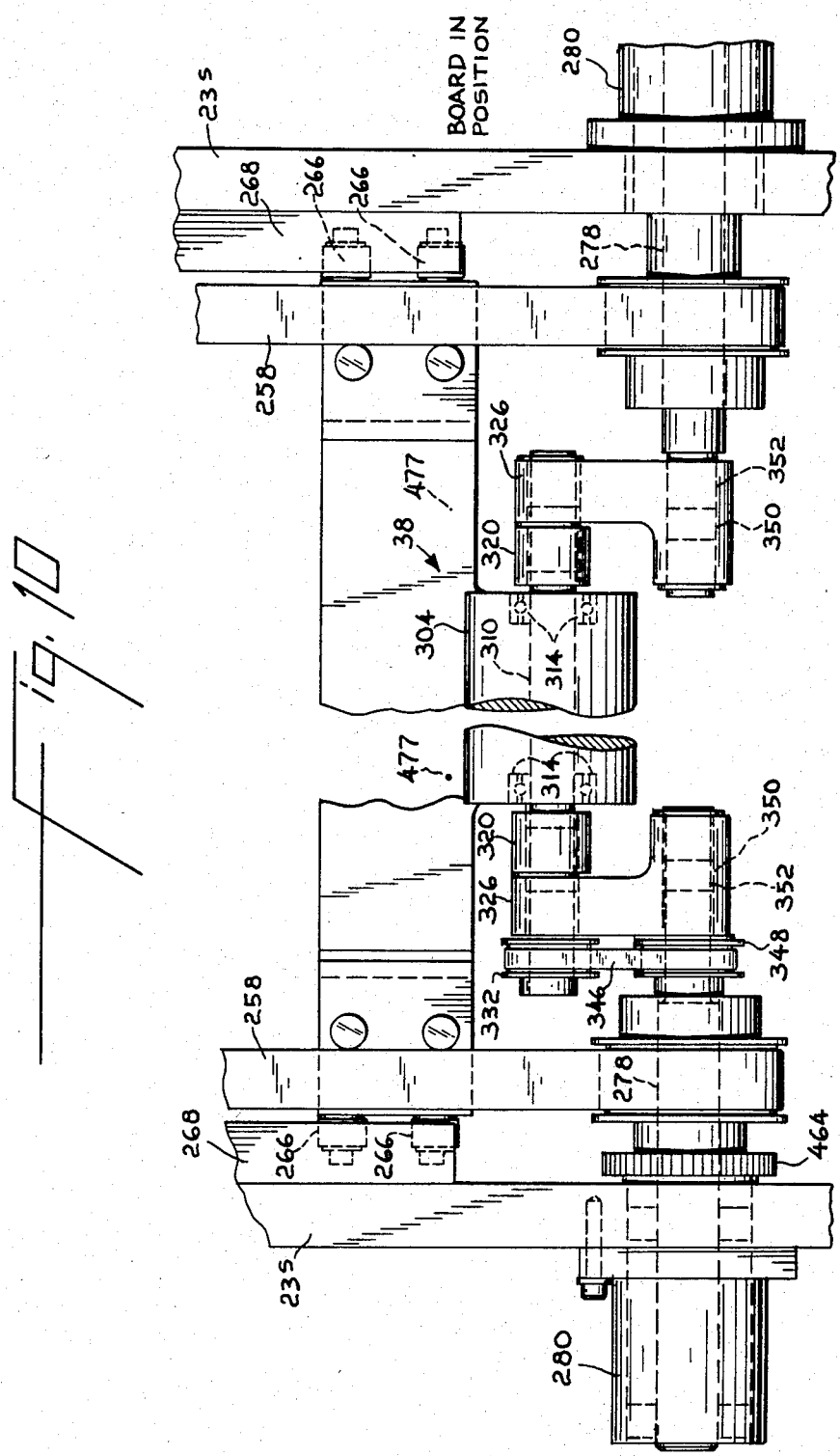

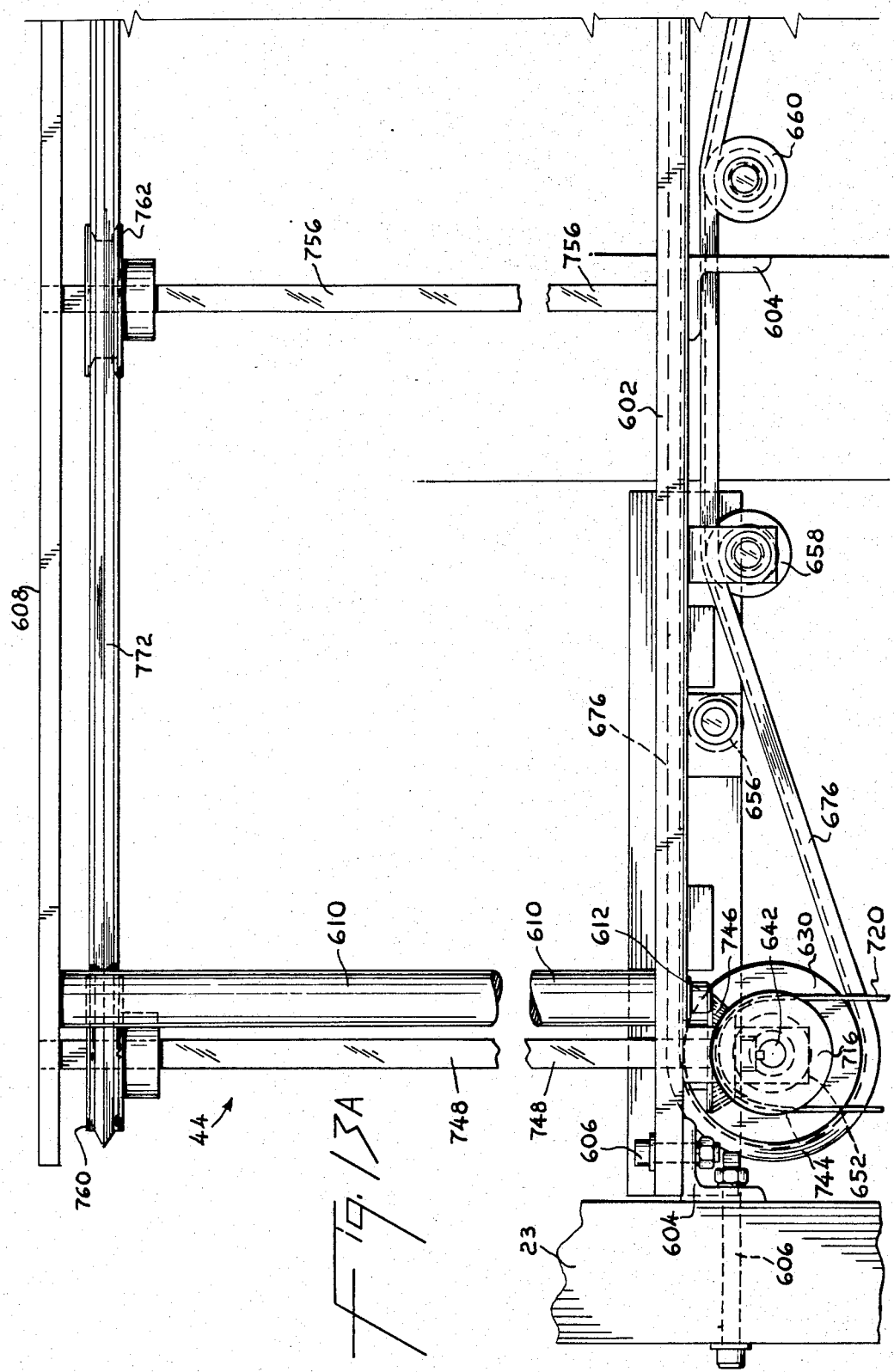

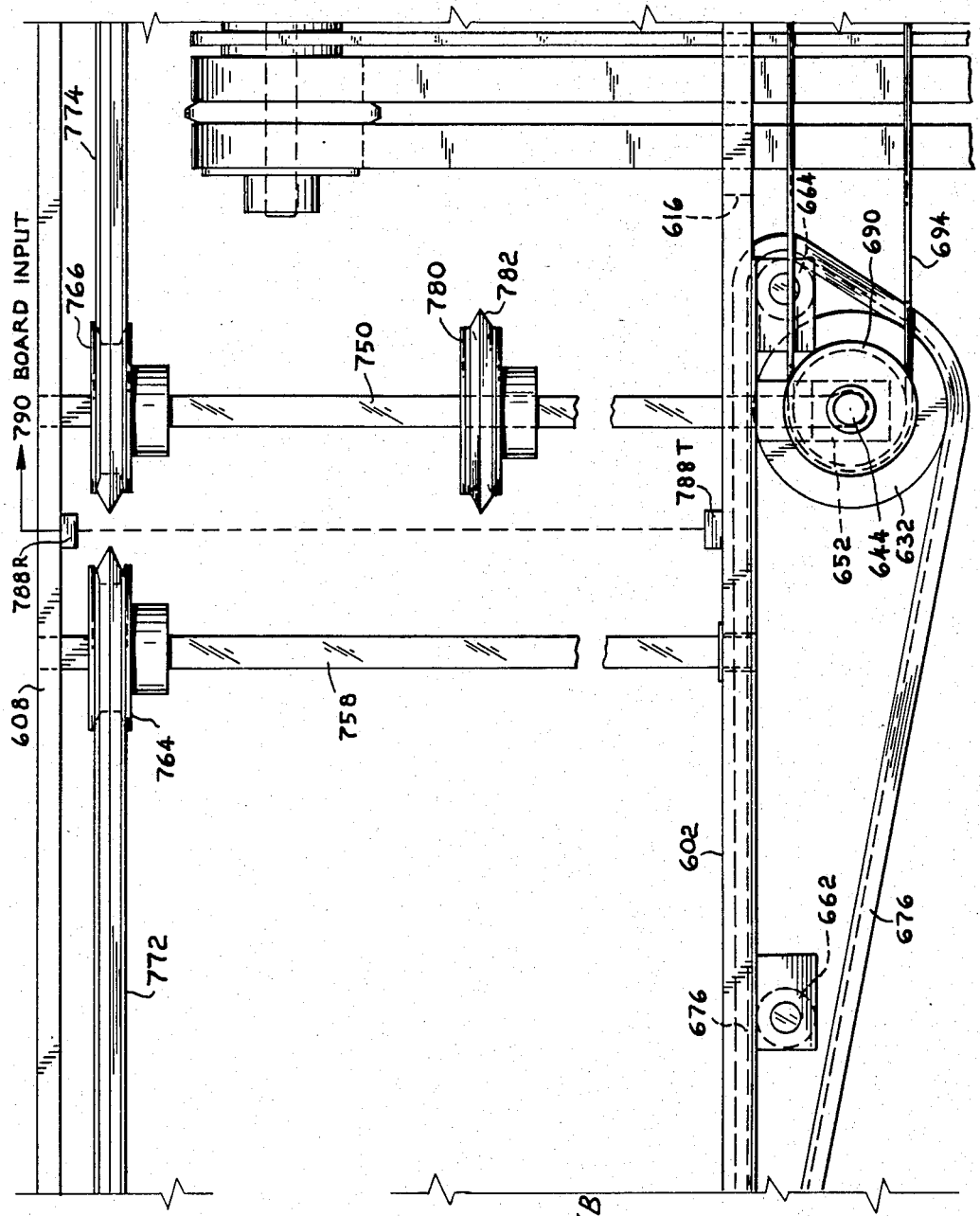

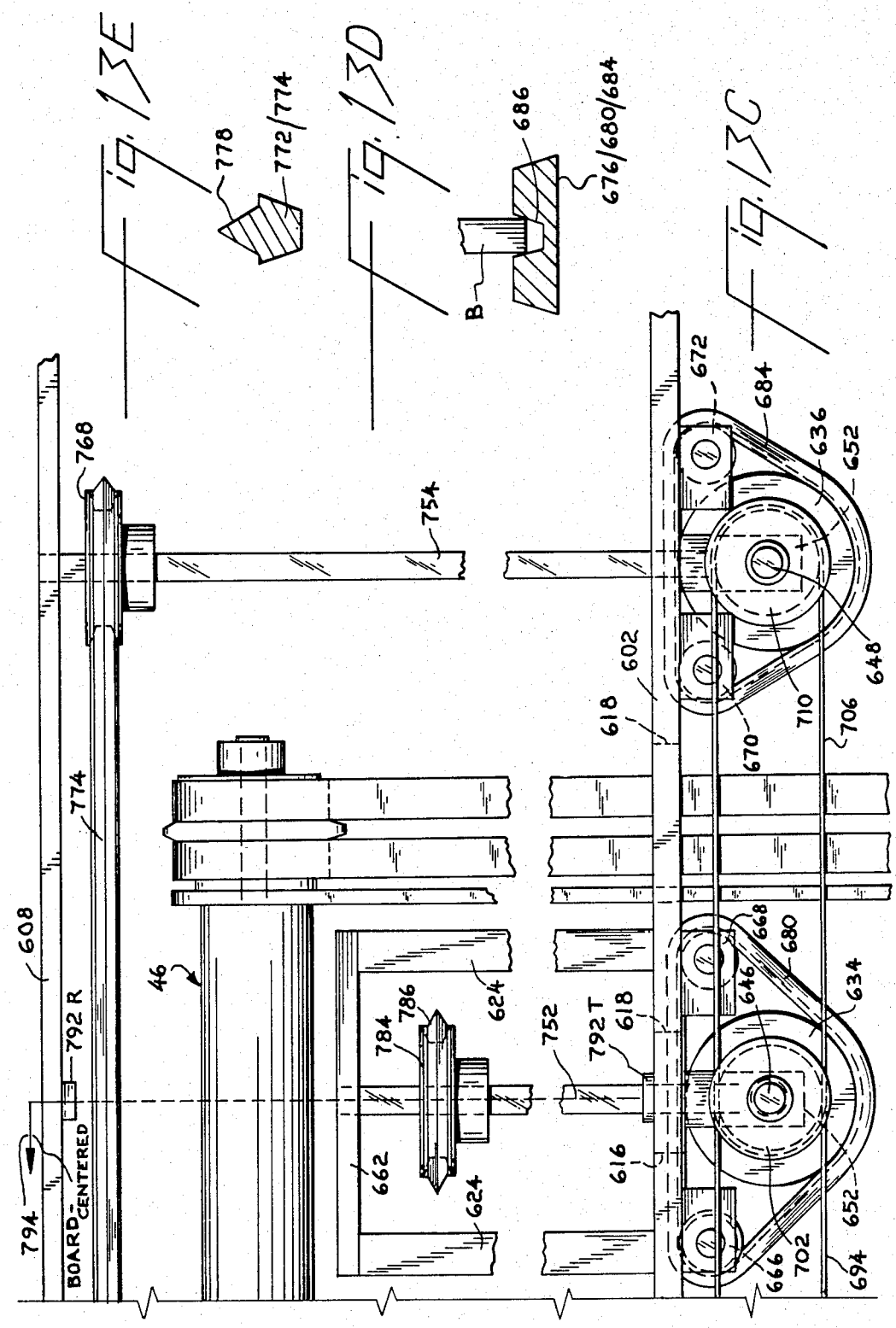

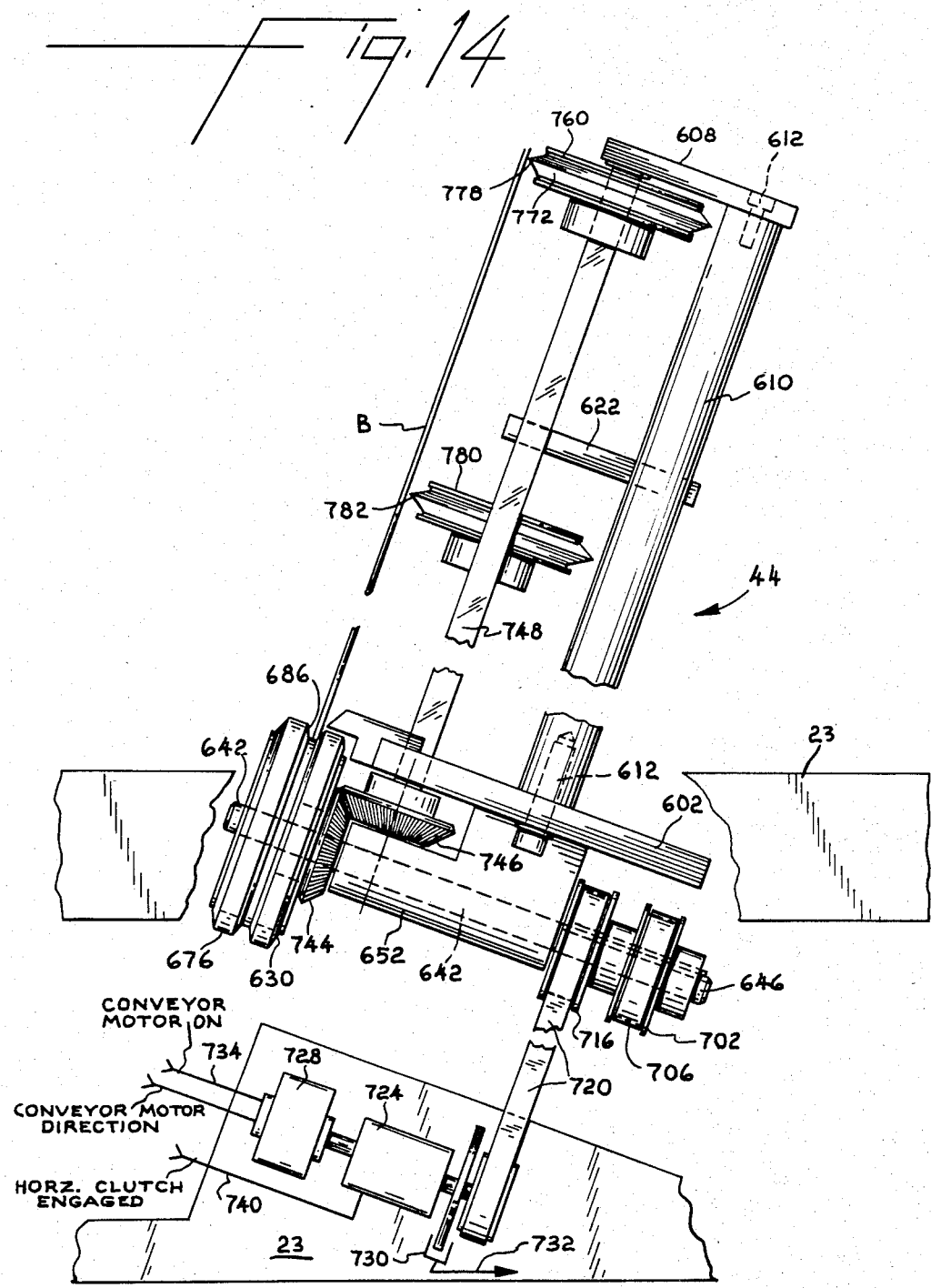

AUTOMATIC REPETITIVE REGISTRATION AND IMAGEWISE EXPOSURE OF SHEET SUBSTRATES

This is a divisional of application Ser. No. 387,534 filed June 11, 1982.

BACKGROUND OF THE INVENTION

There is a continuing need in the printed circuit, graphic arts, and related industries to transfer images photographically from original (positive or negative) photomasks to one or both sides of a light sensitive sheet element in a repetitive manner. In many important cases, these images must be aligned or registered precisely to locations previously established on the element. In the case where images are transferred to both sides of the element, it is often further required that the front and rear images also be registered precisely to each other. In all cases, the photographic operation is carried out in a manner which maintains, to the greatest precision possible, both the definition and the relative locations of the features of the images, while minimizing the transfer of undesired or spurious features.

Printed circuits are often prepared by a repetitive image transfer process using dry film photoresists. The equipment used to practice the photoresist process has consisted in general of discrete pieces such as a cleaner or scrubber for cleaning the copper-clad substrate boards, an oven for preheating the boards, a roll laminator applying heat to the film and board as it laminates them together, an actinic radiation exposure station, and solvent wash-out apparatus for developing a resist image on the copper substrate. Such processes and equipment are fully described in Coombs, "Printed Circuits Handbook", McGraw-Hill Second Edition (1979) and in DeForest, "Photoresist Materials and Processes", McGraw-Hill (1975).

Typically, manual transfer and positioning of the substrate board occurs between each piece of equipment which increases expense and lessens reproducibility, leading to yield loss in the process.

Various attempts have been made to automate the photoresist process but automation has been adopted to only a limited extent. Recently, however, board trimming has been successfully incorporated into an integrated high productivity cleaning and laminating system as disclosed in U.S. Pat. No. 4,293,635 and European Patent Application No. 81104013.8, U.S. Ser. No. 153,636 and U.S. Ser. No. 153,637, both filed May 27, 1980. This automation results in substantial cost savings to the user. Nevertheless, many of the subsequent steps remain highly labor intensive and prone to human error. This is particularly true of the registration and exposure steps.

Contact printing is virtually the universal method of exposure used today in printed circuit photofabrication despite certain known shortcomings. Although low in equipment costs, simple to use, and capable of excellent line definition, contact printing is labor intensive and slow (because of long vacuum draw-down times). It also is subject to losses due to damaged or dirty photomasks resulting from repeated use. This, in turn, requires frequent and expensive touch up and replacement of photomasks to avoid yield penalties. Much time is also lost in the constant and tedious process of inspecting photomasks for defects between exposure. In addition, variations in frame temperature and ambient humidity affect corner-to-corner registration, especially for large boards, unless expensive, fragile, glass photomasks are used.

Alternative exposure methods such as gap printing, projection printing and laser scanning each offer some significant advantages over contact printing. However, in the current state of development, all have serious limitations for high productivity applications and are intrinsically much higher in equipment cost.

SUMMARY OF THE INVENTION

The present invention is directed to a process of registering and imagewise exposing to actinic radiation a sequence of similar sheet substrates, each substrate containing a photosensitive layer, comprising the steps of:
(1) advancing a substrate to a position in a device to undertake in either order or concurrently
  (a) aligning the substrate and a photomask in a predetermined relationship to one another,
  (b) applying a liquid between the photosensitive layer and the photomask,
(2) contacting through the liquid layer the substrate containing the photosensitive layer and the photomask whereby during said contacting substantially no movement of the photosensitive layer relative to the photomask occurs other than a more intimate contact due to displacement of the liquid in a liquid layer and whereby at least one of interfacial or viscous force due to the liquid layer aids in holding the photosensitive layer and photomask in a fixed position relative to one another;
(3) exposing the photosensitive layer to actinic radiation through the photomask;
(4) removing the photomask from the exposed photosensitive layer;
(5) removing the substrate from the device whereby steps 1 to 5 can be repeated; and
(6) repeating steps 1 to 5 for each of said similar sheet substrates whereby substantially identical imaged substrates are obtained.

In a preferred embodiment of the process of the present invention, both sides of the substrate contain photosensitive layers and both layers are exposed to actinic radiation.

BRIEF DESCRIPTION OF THE DRAWINGS

The invention will be more fully understood from the following detailed description thereof taken in connection with the accompanying drawings, which form a part of this application and in which:

FIGS. 1 and 2 are, respectively, a front and side elevation of a circuit board exposure apparatus in accordance with the present invention;

FIGS. 4A and 4B together illustrate a plan view of a board registration and of a board clamping arrangement used in a circuit board exposure apparatus of the present invention taken along view lines 4—4 in FIG. 1;

FIGS. 5A and 5B together illustrate a front elevation view of the elements shown in FIGS. 4A and 4B, respectively, and further provide a front elevation view of one roll used in the laminating arrangement of the circuit board exposure apparatus of the present invention;

FIGS. 6 and 7 are side elevation views partially in section taken along section lines 6—6 and 7—7 respectively in FIG. 4A illustrating the registration arrangement of the circuit board exposure apparatus in the open and closed positions;

FIG. 8 is front elevation view partially in section taken along section lines 8—8 in FIG. 4A;

FIG. 9 is a plan view taken along section lines 9—9 in FIG. 1 illustrating the laminating arrangement used in the circuit board exposure apparatus of the present invention;

FIG. 10 is an elevation view partially in section taken along section lines 10—10 in FIG. 9;

FIG. 13A to 13C taken together illustrate a front elevation view of a board conveyor arrangement used in the circuit board exposure apparatus of the present invention, while FIGS. 13D and 13E are section views through the lower and upper conveyor belts, respectively;

FIG. 14 is a side elevation view of the board conveyor arrangement shown in FIGS. 13A to 13C;

DETAILED DESCRIPTION OF THE INVENTION

Figure 1:
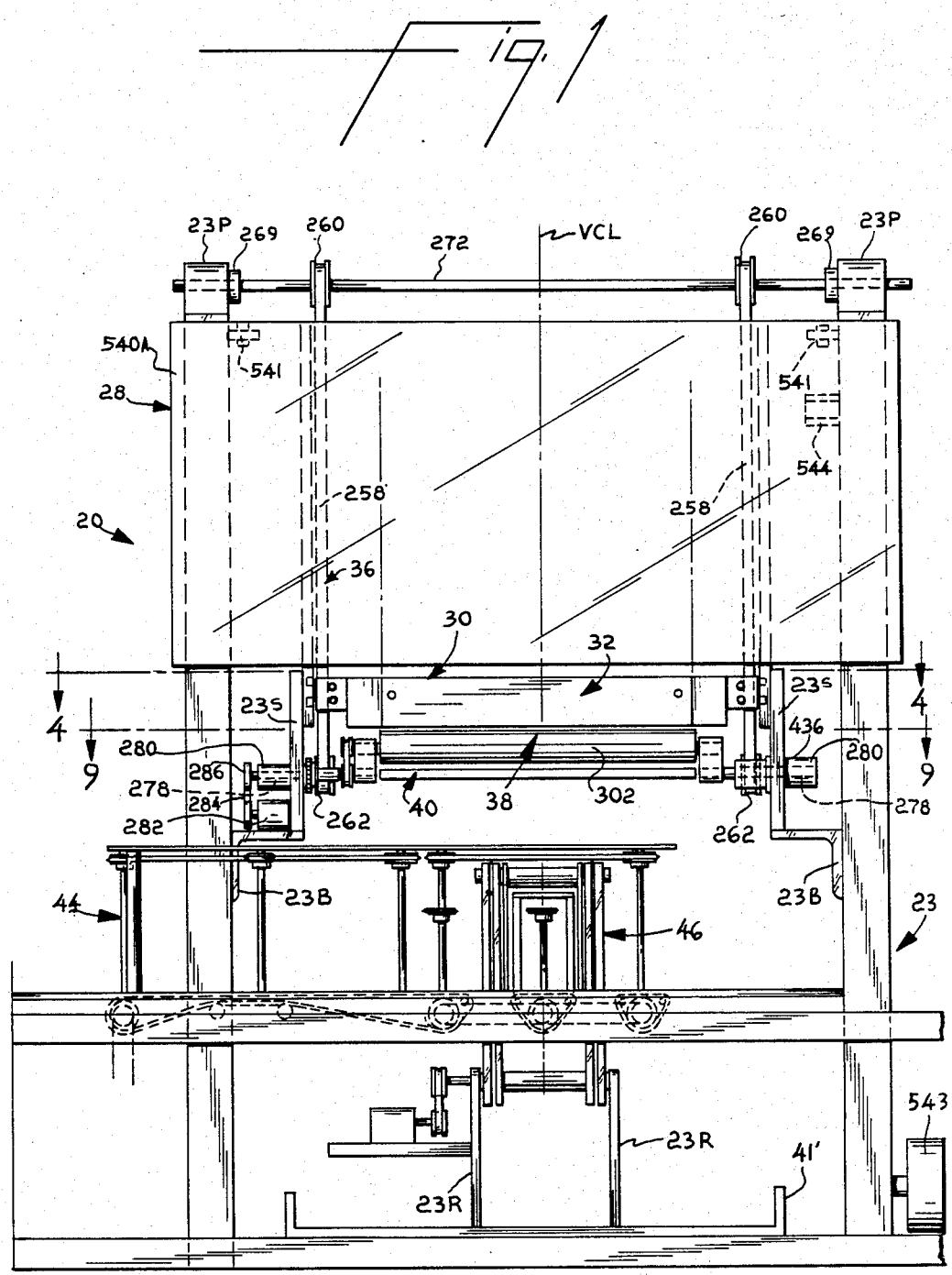

In the process of this invention a sequence of substrates containing a photosensitive layer with or without a top support sheet is introduced in sequence into a registration and exposure device. This substrate with the photosensitive layer which may have a separate top support film is also referred in the present disclosure as a sensitized substrate and as a circuit board. The photosensitive layer composition which is not present as a liquid preferably comprises a photosensitive polymer which can be negative or positive working. Conventionally the substrate is rectangular. The registration portion of the apparatus consists of one or two film elements, preferably rectangular and flexible, at least one of which is a photomask. The leading edges of the elements can be joined in parallel, hinged, relationship on each side of a thin rectangular carrier whose thickness approximates the thickness of the photosensitive sheet. The hinged relationship maintains the registration between the photomasks and the carrier. When both film elements are photomasks, they are maintained in precise register with each other by virtue of their hinged relationship to a common carrier.

With the photomasks hinged outward from the carrier, the sensitized substrate is positioned or aligned between the film elements so that one substrate edge is in registration contact and approximately parallel to the length of the carrier. In some instances registration contact can be simple edge-to-edge contact of the substrate with the carrier wherein the only added criterion is that the image pattern portion of the photomask is completely contained within the area of the sheet to be imaged. However, registration contact more generally requires the precise alignment of details contained on the photosensitive sheet of the substrate with details of the photomask image or images. In this instance at least two contact points on or in the sheet are brought into a fixed relationship with two corresponding contact points fixed to the carrier. Such points may be notches and tabs suitably spaced on the sheet and carrier edges. Alternatively the points may consist of registration pin and hole combinations wherein the sheet contains precision drilled registration holes which are positioned in the desired orientation to the bar by registration pins. The registration is substantially identical from substrate to substrate to obtain a series of substantially identical exposed photosensitive layers on the substrates for subsequent processing.

Once the sensitized substrate is in registration relationship to the carrier, the flexible film photomasks can be applied to opposite sides of the sensitized substrate in the presence of a liquid interface by applying normal pressure in a line roughly parallel to the carrier on the outer surfaces of the photomasks at or near the hinged edges and advancing (relatively) the pressure line in the direction perpendicular to the hinge line and parallel to the sensitized substrate surface and, concurrent with the advance, applying the liquid, e.g., by spraying, to the nip between the substrate and the inner surface of the photomask formed by the advancing pressure line. In effect the photomasks are temporarily wet laminated to both sides of the sensitized substrate to give a registered sandwich structure in which the sensitized substrate is separated from each photomask surface by a liquid interface. This lamination process step is preferably carried out by passing the hinged photomask-registered sheet assembly through a pair of pressure rollers. In this mode of operation, pressure is applied at or near the hinged leading edge of the sensitized substrate and the flexible photomasks and the trailing portions of each photomask wrap partially around the curved surface of each pressure roll. Liquid, preferably water, is they sprayed into the two nips on each side of the sensitized substrate. Preferably, the registration apparatus is oriented so that the general direction of the wet lamination is upward, i.e., the sensitized substrates travels in an upward direction relative to the pressure rolls and liquid applicators. When so oriented, a cleaning action of the liquid can be achieved on both the photomask and the photosensitive layer or support sheet which is enhanced by the use of excess liquid directed at both surfaces and which will simply drain into a catching basin carrying any extraneous matter with it. In addition, the area above the pressure rolls where actinic exposure preferably occurs can more easily be kept free of unwanted liquid. This process of obtaining alignment of a substrate and photomask is obtained without the use of vacuum. Although a suction can be used to remove excess liquid, it is understood that a vacuum is not necessary for holding the substrate and photomask in contact with one another.

It is understood that in the present specification during the liquid contact of the substrate and photomask "substantially no movement" means that surface of the photosensitive layer and the photomask do not move relative to one another in directions parallel to their surfaces, i.e., the surfaces do not slide relative to one another to change the alignment of the photomask to the substrate. However, it is understood that "substantially no movement" allows relative movement of the photomask and the photosensitive layer in the direction perpendicular to their surfaces to form a more intimate contact, e.g., as liquid is squeezed from the interface between the photosensitive layer and the photomask. However, the photosensitive layer and photomask, already contacted by the advancing pressure line, will remain in a fixed relationship in directions parallel to their surfaces.

Also it is understood in the present specification that "contacting" through the liquid a substrate containing a photosensitive layer and a photomask does not exclude intermediate layers. For example the photosensitive layer may have a support or cover sheet which allows actinic radiation to pass or the photomask may contain a release coating. Such support or cover sheet or release coating could contact the liquid.

In the present specification a photosensitive layer is employed to mean a preformed layer and excludes a photosensitive layer present as a liquid.

Once the photomasks have been fixed in register over the photosensitive layer, the substrate with its photosensitive material may be exposed to any source of radiation actinic to the photosensitive material for a prescribed period of time. In a preferred mode of operation, the laminated element emerges from the pressure rollers, is stopped and suspended in a fixed upright position and uniformly exposed to actinic radiation in the 3000 to 4000 Å or above region. When both sides of the substrate are photosensitive, both sides preferably are exposed simultaneously. In an alternative mode of operation, the sensitized substrate is irradiated with actinic radiation as it emerges from the pressure rolls and is carried past the irradiation region. In this mode, the irradiation may be focused to a band or a transversely scanned spot of intense actinic radiation may be used which can be modulated to match the image to be recorded to the exposure characteristics of the photosensitive surface and the rate of transport. It is also possible to completely remove the sensitized substrate from the registration device and expose it on any suitable exposure unit. In this instance the photomasks and carrier remain fixed in registration with the photosensitive layer by the action of surface or viscous forces induced by the interface liquid and no separate device, e.g., a vacuum force, is needed to maintain intimate contact. It is understood that both surface and viscous forces may be present.

In the above process steps the rectangular, flexible film elements have been identified as photomasks. When both sides of an element to be imaged are photosensitive, as with two sided circuit boards, both film elements contain opaque and transparent image areas. However, when only one side of a photosensitive element is to be imaged, e.g., a one-sided circuit board, only one film element (of a pair, if present) is required to be a photomask.

When imaging exposure is complete, both photomasks are peeled from the surfaces of the exposed photosensitive element thus releasing the imaged element from registration. The imaged element is then transferred from the registration-exposure apparatus to a subsequent processing station, e.g., solvent development. The hinged photomask-carrier assembly is returned to its initial position to receive the next sensitized substrate and repeat the registration-exposure sequence. In a preferred mode of operation, after exposure, the pre-exposure process steps, for the most part, are reversed. Thus the exposed laminated element passes back through the pressure means such as rollers and each photomask is pulled back over its respective pressure roller into a storage area until the hinged area on the carrier is reached. Other means than rollers may be used to apply pressure, e.g., a squeegee. At or near this point the photomask-carrier assembly stops and the imaged substrate is ejected to a device which conveys the substrate from the registration-exposure apparatus. Also, the pressure means may be movable and the apparatus holding the registered substrate with the photomask may be stationary. In such a mode of operation the apparatus would be substantially ready to accept the next sheet in the series to be exposed. In the preferred operation after exposure, the motion of the imaged substrate is in a downward direction and the pressure rollers are separated to allow the imaged substrate to drop to the conveying means. The photomasks can be stored in any number of ways as they are peeled from the imaged sheet. The preferred mode of storage is on a take-up drum on which the photomask surface remains free of extraneous contact. Alternatively, the photomasks can be stored suspended, or can be wound around the pressure roller itself.

The sheet substrate during the registration and imagewise exposure process may be in any orientation including a horizontal plane or vertical plane. Also the substrate may move in a relative downward direction. Preferably the substrate will be in a vertical or substantially vertical plane and which move in a relative upward direction. In the process of this invention any means can be used to convey the sensitized substrate to and from the registration position in the apparatus. For the preferred mode of operation in an upward-downward direction, the sensitized substrate can be conveyed horizontally on its edge by a belt until positioned under the carrier at which point it is elevated into registration contact by a lifting device. After exposure, the imaged sheet is dropped to the conveyor belt which conveys it horizontally on edge out of the apparatus.

The liquid which is applied to the photosensitive layer or support sheet and photomask serves several vital functions in the process of this invention. The liquid serves to uniformly fix the photomask in intimate registered contact to the photosensitive surface or support sheet during actinic exposure and after exposure allows the photomask to be easily removed from the exposed sensitized substrate without damage or transfer of either. Preferably a large excess of liquid is flushed over the surfaces of both the phototool and substrate. The excess liquid serves to clean repeatedly the surface of the photomasks and individually each photosensitive surface or support layer thus preventing buildup of element born dirt with subsequent deterioration of the photomask image and/or the resulting exposed image. Besides these vital functions the liquid also serves to condition and cool the photomask which tends to get warm as it absorbs radiation during the repeated exposures. Thus, during repeated exposure, the environment and temperature of the photomask is maintained constant and less susceptible to changes in ambient temperature or humidity. In this respect, it is also desirable to spray liquid on the exterior surface of the photomask, provided the liquid forms a uniform film on the exterior surface or is removed therefrom before actinic exposure. The liquid interface should be substantially transparent to actinic radiation and should not damage the photomask or the photosensitive sheet surfaces or cover sheet. Also it should not interfere with the exposure of the photosensitive layer. The liquid should preferably wet both surfaces of the photomask and photosensitive layer of support sheet, have low volatility at ambient temperatures, and have sufficient viscosity to fulfill the vital functions of the liquid. The preferred liquid is water or aqueous solutions containing adjuvants which improve liquid characteristics, e.g., surface active agents, viscosity adjusting agents, etc. Other liquids, of course, can be used depending on the conditions required, e.g., alcohols, glycols, glycol ethers, halogenated hydrocarbons, paraffins, etc., provided they fullfil the above criteria. In an instance when long exposure times are required with actinic sources which induce buildup of heat, a high boiling point liquid like ethylene glycol is preferred. Since the liquid remains a liquid after the exposure step, a photosensitive liquid is not used for this component of the process.

The repetitive process of this invention is particularly suited to the mass production of identical circuit boards. In addition the process is useful in many image reproduction processes where multiple copies or images are needed. Thus identical lithographic printing plates, photomask transparencies, multicolored pictures, etc. are possible by the process of this invention using the technology disclosed for example in U.S. Pat. Nos. 3,060,024; 3,458,311; 3,582,327; 3,649,268; 4,053,313; 4,054,483; 4,126,466; 4,157,407; 4,173,673; 4,174,216; 4,191,572; and 4,323,637 which are incorporated herein by reference.

The process of this invention is useful for imaging any sensitized substrates which is compatible with the liquid treatment. If the photosensitive composition is not compatible with the liquid preferably a support or cover sheet than will be used to protect the composition. In such a case the support sheet will contact the liquid. The process is particularly useful for exposing elements having a photoresist surface or surfaces which are typically used for producing printed circuit boards, lithographic printing plates or any other thin mask image.

The repetitive registration and imagewise exposure process of the present invention is applicable to a wide variety of sheet substrates provided at least one surface contains a photosensitive layer with the optional support sheet. In a preferred mode, opposite surfaces of the sheet substrates carry photosensitive layers with the registration and imagewise exposure performed simultaneously or substantially simultaneously on both surfaces.

In one of the modes of the invention, the sheet substrate will contain a smooth surface, e.g., copper, onto which the photosensitive layer is laminated. In such case, the substrate surface over which the photosensitive polymer layer is laminated will be free of circuitry (although through-holes may be present).

Alternatively, the substrate surface onto which the photosensitive layer is laminated may contain circuitry in relief and need not be smooth. In such case, the registration and imagewise exposure process can take place in similar fashion to a smooth surface, including simultaneous or substantially simultaneously registration and imagewise exposure of opposite surfaces which have photosensitive polymer layers.

In practicing the invention, a sheet substrate bearing photosensitive film resists of various types, e.g., negative and positive working, may be used. In general photohardenable, negative-working resists can be photopolymerizable films of the type disclosed in U.S. Pat. No. 3,469,982 and the photocrosslinkable elements of the type disclosed in U.S. Pat. No. 3,526,504. Positive-working, resist elements may be of the photosolubilizable type, e.g., such as the o-quinone diazide elements of U.S. Pat. No. 3,837,860, or of the photodesensitizable type, e.g., such as the bisdiazonium salts of U.S. Pat. No. 3,778,270 or the nitroaromatic composition disclosed in U.S. Pat. No. 4,269,933 or U.S. Pat. No. 4,162,162.

The photosensitive layer used in the process is preferably processible in aqueous alkali in the sense that it is soluble and thereby developable in an aqueous alkali solution, e.g., 1 wt. % $Na_2CO_3$ at 29.4° C. when sprayed for 90 seconds.

An element containing an image-yielding, nonblocking photopolymerizable stratum on a strippable support is preferably used such as the one described in copending U.S. Pat. No. 4,293,635 and applied to a substrate by the processes described in EP08110413.8 and U.S. patent application Ser. No. 153,636 filed May 27, 1980. Alternatively, particularly if the photopolymerizable layer is tacky, the remaining surface of the supported, photopolymerizable stratum may be protected by a removable cover sheet and is applied to a substrate by the process described in U.S. Pat. No. 3,469,982. The photosensitive composition is preferably about 0.0003 inch (0.0008 cm) to about 0.01 inch (0.025 cm) or more thick. The photosensitive element may be rigid or highly flexible depending on the desired end use of the processed element. Also, in instances where the photosensitive layer is self-supporting, e.g., such as elements disclosed in U.S. Pat. No. 4,054,479, an underlying substrate portion which is not photosensitive would be present.

The substrate supporting the photosensitive layer may be any sheet material which is compatible with the end use of the layer and include metal foils or plates, metal clad boards, plastic films, sheets or plates, glass or ceramic plates, impregnated fiber boards or paper, foraminous sheet material like paper, cloth, or screens. The substrate surface may be planar or may contain a relief image or pattern of either the same or a different material, e.g., a printed circuit. In a preferred process of this invention, the substrate conributes to the production of a printed circuit.

Generally, suitable substrates for the process of the invention involving printed circuit formation are those which have mechanical strength, chemical resistance and good dielectric properties. Thus, most board materials for printed circuits are thermosetting or thermoplastic resins usually combined with a reinforcing agent. Thermosetting resins with reinforcing fillers are ordinarily used for rigid boards, whereas thermoplastic resin without reinforcements are usually used for flexible circuit boards. Ceramic and dielectric coated metals are also useful.

Typical board construction involves combinations such as phenolic or epoxy resins on paper or a paperglass composite, as well as polyester, epoxy, polyimide, polytetrafluorethylene, or polystyrene on glass. In most instances, the board is clad with a thin layer of electroconductive metal of which copper is by far the most common. Frequently the boards will contain holes for component mounting, for interconnecting circuit layers, and for registration.

It is essential that the printed circuit substrates used in the process of the invention be clean and free of any extraneous materials to insure that these materials do not interfere with wetting and bonding of the surface. For this reason, it will frequently be desired to clean printed circuit substrates prior to lamination of the dry resist film by one or more of the several cleaning processes which are well-known in the field of printed circuit board manufacture. The particular type of cleaning depends upon the type of contamination, e.g., organic, particulate or metallic. Such methods include degreasing with solvents and solvent emulsions, mechanical scrubbing, alkaline soaks, acidification and the like, followed by rinsing and drying. A particularly preferred process of substrate cleaning and resist application to form a sensitized substrate is disclosed in U.S. patent application Ser. No. 153,636, filed May 27, 1980 refiled as Ser. No. 341,618.

Suitable substrates for the process of the invention involving preparation of lithographic printing plates are those which have mechanical strength and surfaces which differ in hydrophilicity or oleophilicity from the surfaces of the imaged photosensitive areas laminated thereto. Such substrates are disclosed in U.S. Pat. No. 4,072,527. While numerous substrates are satisfactory for this purpose thin anodized aluminum plates such as disclosed in U.S. Pat. No. 3,458,311 are particularly useful.

A suitable substrate material for preparing a mask image is a transparent polymeric or glass sheet or plate with suitable subcoatings or surface treatment if needed. Polymeric sheets preferably have a high degree of dimensional stability to temperature changes, may be chosen from a wide variety of films composed of high polymers, e.g., polyamides, polyolefins, polyesters, vinyl polymers, and cellulose esters, and may have a thickness of from 0.00025 inch (0.0006 cm) to 0.008 inch (0.02 cm) or more. A particularly suitable substrate is a transparent polyethylene terephthalate film having a thickness of about 0.001 inch (0.0025 cm).

The photosensitive elements useful in the invention will comprise at least one photosensitive layer. The photosensitive layer may be either positive or negative working as disclosed in "Light Sensitive System" by Jaromir Kosar, John Wiley & Sons (1965), deForest, supra, and Coombs, supra. The layer may be applied to the substrate either as a coated liquid or laminated as a dry film element. A particularly preferred, photosensitive polymeric layer is a photohardenable layer prepared from polymeric components (binders), monomeric components, initiators and inhibitors. A top support or cover sheet may be present during exposure provided it does not interfere with this step. Support and cover sheets are well known in the art. A several layered support or cover sheet may be used also.

Suitable binders which can be used as the sole binder or in combination with others include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adiptic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

For aqueous development the binder should contain sufficient acidic or other groups to render the composition processible in aqueous developer. Useful aqueous-processible binders include those disclosed in U.S. Pat. No. 3,458,311 and in U.S. Pat. No. 4,273,857. Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,635 which is incorporated herein by reference.

It is preferred that the photosensitive layer be relatively harder than those which generally have been commercially available. Greater hardness of the layer provides greater dimensional stability and there is less requirement for a cover or support film.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of tetrachloro-bisphenol-A, di-(2-methacryloxyethyl)ether of tetrachloro-bisphenol-A, di-(3-methacryloxy-2-hydroxypropyl)ether of tetrabromo-bisphenol-A, di-(2-methacryloxyethyl)ether of tetrabromo-bisphenol-A, di-(3-methacryloxy-2-dydroxypropyl)ether of 1,4-butanediol, di-(3-methacryloxy-2-hydroxypropyl)ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benezene, and 1,3,5-triisopropenyl benzene.

In addition to the ethylenically unsaturated monomers mentioned above, the photohardenable layer can also contain at least one of the following free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such herteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketadonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos.: 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos.: 3,427,161; 3,479,185; and 3,549,367 can be used as initiators. Similarly the cyclohexadenone compound of U.S. Ser. No. 271,241 filed June 8, 1981 are useful as initiators. Also useful with photoiniators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however should preferably be transparent to the actinic radiation used.

The preferred process of this invention will now be described in reference to the Figures in which the sensitized substrate is prepared as described in Example 1 of European Patent Application 81104013.8 with either one or both sides of substrate bearing a solid photosensitive layer.

With reference to FIGS. 1 and 2 shown in front and side elevation, respectively, is a circuit board exposure apparatus generally indicated by reference character 20 adapted to register a circuit board indicated by the reference character B (FIG. 2) with one or two flexible film elements, or "photomasks" and thereafter expose one or both sides of the board. In the preferred embodiment, the board is registered and exposed while in an upright or substantially vertical orientation. It should be understood that FIGS. 1 and 2 are stylized assembly views intended to impart a general overview of the location of the various functional elements which comprise the apparatus 20. Accordingly some elements present in one view are omitted in the other to afford clarity of illustration. Detail views of various functional elements are set forth in other Figures.

As shown in FIGS. 1 and 2, the circuit board exposure apparatus 20 comprises a framework 23 which supports the various functional elements of the apparatus, an exposure unit 28 mounted to the framework 23, a registration arrangement 30 for registering a circuit board with one or two flexible photomasks, a clamp arrangement 32 for securely engaging the registered board and photomask(s), a board displacing arrangement 36 for moving the registered board B and photomask(s) from, for example, a registration position (located beneath the exposure unit 28 when operating in the preferred embodiment) to an exposure position within the exposure unit 28, a laminating arrangement 38 for laminating the photomask(s) to the surface of the board as the engaged board and photomask(s) are moved by the board displacing arrangement 36, and an applicator arrangement 40 disposed in a trough 41 (FIG. 2) adapted to apply a liquid to each surface of the board B as a photomask is laminated thereto. A photomask take-up arrangement 42 (FIG. 2) is provided to let-out and reel-in the photomask(s) as the registered board and photomask(s) are moved. In addition, a board conveyor arrangement 44 (FIG. 1) is mounted to the framework 23 and is operative to sequentially convey boards to be laminated into a board transfer arrangement 46. The board transfer arrangement 46 is pivotally mounted with respect to the framework 23 and is operative in the preferred embodiment to transfer boards from the conveyor 44 into the registration position and to receive and transfer exposed boards to a suitable collection arrangement (not shown). A suitable electrical control network is interconnected with the various drives, actuators and sensors discussed herein to control the operation of the board exposure apparatus 20. The control network may be physically mounted to the framework 23 at any convenient position. In the preferred embodiment, the board displacing arrangement 36, the board conveyor arrangement 44 and the board transfer arrangement 46 are disposed substantially upright but slightly inclined (at about ten to twenty degrees) with the vertical.

Figure 3:
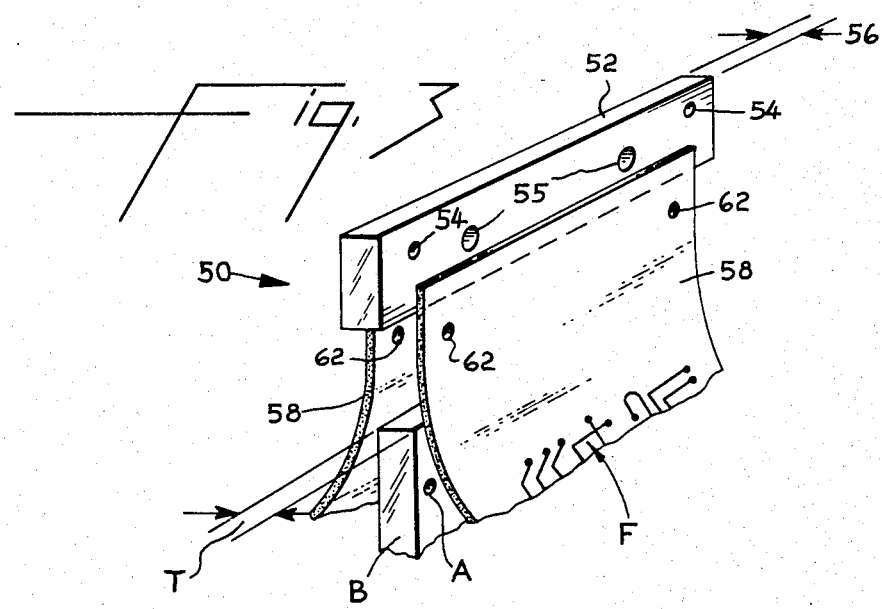
FIG. 3 is a perspective view of a photomask carrier assembly used in the circuit board exposure apparatus of the present invention.

FIG. 3 is a perspective view of a photomask carrier assembly generally indicated by reference character 50 used in the circuit board exposure apparatus 20 of the present invention. The assembly 50 includes a carrier bar 52 provided at suitable locations thereon with registration holes 54 and with openings 55 sized to receive clamp fingers 214 (discussed in connection with FIG. 4). Since most of the structural elements and features discussed herein are symmetrical about the vertical centerline VCL of the apparatus 20, like reference numerals are used to indicate corresponding elements or features on each side of the vertical center line. The carrier bar 52 is selected to exhibit a thickness dimension 56 that is substantially equal to the thickness dimension T of the circuit board B to be exposed. The board B is provided with registration apertures A.

Depending in a parallel hinged relationship from each lateral surface of the carrier bar 52 are flexible film elements or photomasks 58. The upper edges of each photomask 58 are hingedly connected by any suitable means of attachment to the carrier bar 52, e.g., by tape, in a precise manner so that corresponding image features on the photomasks 58 (shown schematically by the reference character F) are in register to each other by virtue of their precise connection to the carrier bar 52. This, in turn, locates the features relative to the registration holes 54. As used herein the term "photomask" means a flexible sheet element having areas which are transparent to radiation actinic to the photosensitive layer and complimentary areas which are effectively opaque to that radiation, the opaque and transparent area defining the complementary image features to be transferred to the photosensitive layer. Each photomask 58 is provided with registration apertures 62 for a purpose discussed herein.

FIGS. 4A, 4B, 5A and 5B show plan and front elevation views of the board registration arrangement 30 and of the board clamp arrangement 32. Section views of these elements are shown in FIGS. 6 and 7. The board registration arrangement 30 comprises a backbar 70 having a locating pin 72 near each lateral end thereof and a front bar 76 reciprocally movable in the direction of arrows 77 with respect to the backbar 70 in a plane parallel to the plane of FIGS. 4A and 4B. The pin 72 shown in FIG. 5B is diamond shape to accommodate thermal expansion between the backbar 70 and the differential carrier bar 72 of the photomask carrier assembly 50. As perhaps best seen in conjunction with FIG. 6, the front bar 76 is provided with registration pins 78 at predetermined locations thereon, the registration pins 78 projecting toward the backbar 70. The front bar 76 is also provided with locating openings 82 at locations on the front bar 76 which confront the registration pins 78 projecting from the backbar 70.

The backbar 70 is an elongated member having a generally rectanguloid configuration with the lower end of the backbar 70 having a tapered flange portion 86 thereon (FIG. 6). As seen in FIG. 6 the boundary of the flange 86 is provided with a radius 88 arranged to match the radius of the rolls used in the laminating arrangement 38 for a purpose discussed in connection with FIGS. 9 and 10. A bore 90 is provided through the flange 86 in locations on the backbar 70 confrontationally corresponding to the registration pins 78 disposed on the front bar 76.

Figure 4A:
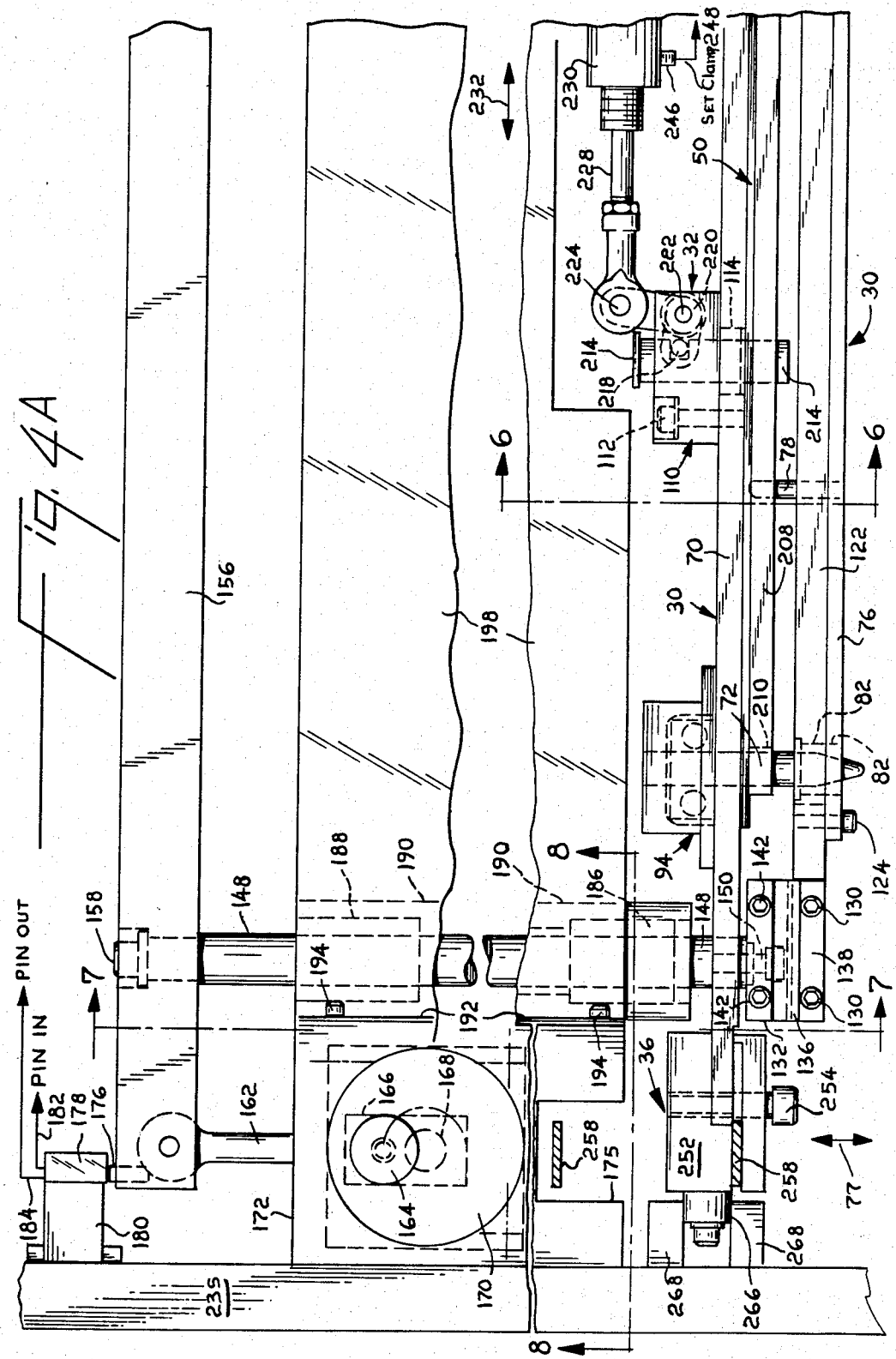
Figure 11:
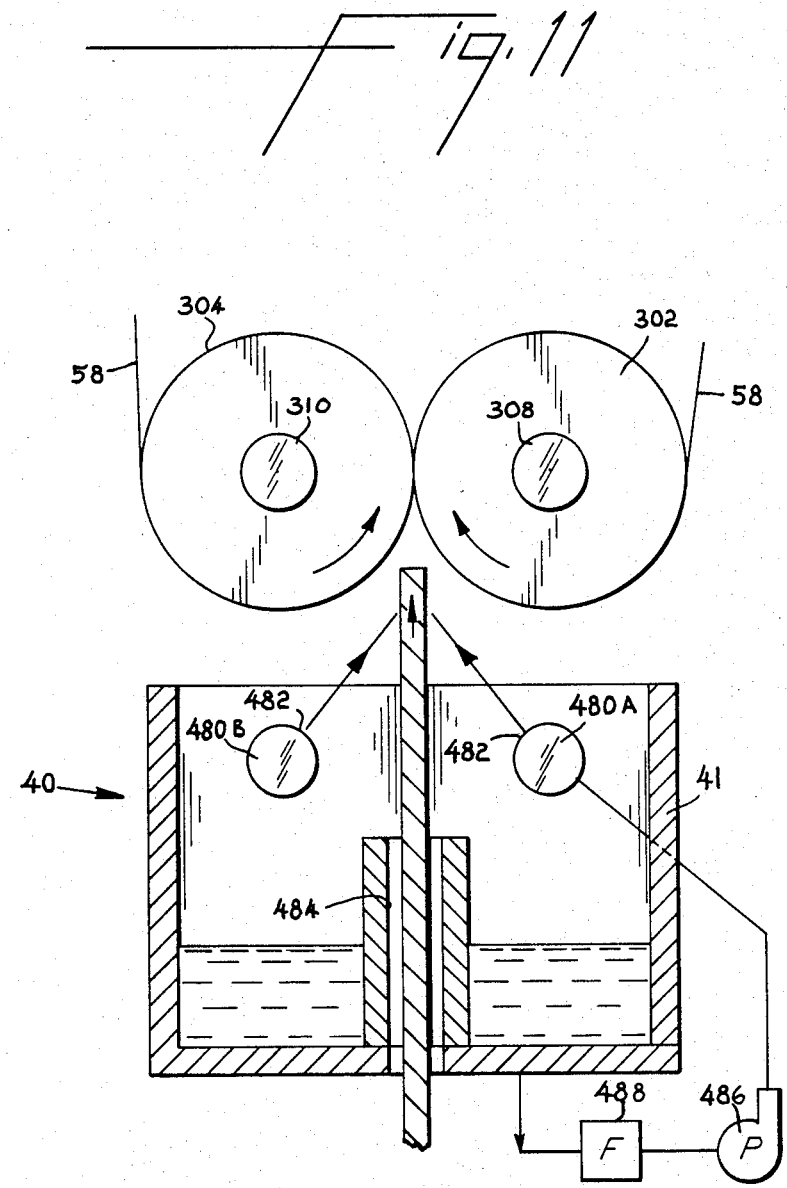
FIG. 11 is a side elevation view similar to FIG. 7 illustrating the applicator arrangement used in the circuit board exposure apparatus of the present invention.

The locating pins 72 are secured to the backbar 70 by any attachment mechanism, shown in FIGS. 4A and 4B by a mounting bracket 94 arranged to facilitate replacement of the pins 72 due to wear or abuse. The backbar 70 is cut out, as at 102 (FIGS. 5A and 5B), to accommodate a rod 148 which is operatively associated with the front bar 76. The laterally outward ends of the backbar 70 are connected to a carriage 252 which is included in the board displacing arrangement 36 discussed herein. Near the center of the backbar 70, clamp support brackets 110 (FIG. 4) are mounted to the backbar 70 by bolts 112. The backbar 70 has clamp access apertures 114 provided in the vicinity of the brackets 110 to accommodate clamp fingers 214 which are a part of the board clamping arrangement 32 also discussed herein.

The front bar 76 is an elongated rectanguloid member which is attached, as by bolts 124 (FIG. 4), to a mounting frame 122. The frame 122 is adapted to accept interchangeable front bars 76 which carry various arrangements of registration pins 78. (The other structural elements of the apparatus, as the backbar 70 and the clamp bar 208, are provided with a suitable array of apertures, as the apertures 90 and 238 (FIG. 6), respectively, to accommodate the various arrays of the registration pins 78). The laterally outward ends of the front bar 76 are connected to a front block 128 by bolts 130. The upper and lower surfaces of the front block 128 are flexibly connected to a rear block 132 by upper and lower leaf springs 136 and 138, respectively. The attachment of the springs to the front block 128 is accomplished by the bolts 130, while the same springs are secured to the rear block 132 by bolts 142. The rear block 132 is connected to a rod 148 which extends rearwardly from the rear block 142. The rod 148 is connected to the block 132 by means of a bolt 150 which extends into the rod 148 through a counterbore provided in the rear block 132. The back end of each of the rods 148 is connected to an enlongated push bar 156 (FIG. 4) by a bolt 158 which extends through a counterbore provided in the push bar 156.

One lateral end of the push bar 156 (the left end as viewed in FIG. 4A) extends past its interconnection to its associated rod 148 where it is pivotally connected to one end of a connecting rod 162 (see also, FIG. 8). The connecting rod 162 is pivotally connected at its other end to a member 164. The member 164 is itself pivotally connected to a crank arm 166 which fits about the drive shaft 168 of a rotary pneumatic actuator 170. The actuator 170 is supported on a plate 172 which is secured by bolts 174 to side plates 23S which in turn are secured to and form part of the framework 23. The plate 172 is provided with cutouts 175 (FIG. 4) through which passes a belt 258 which is a part of the board displacing arrangement 36. Rotation of the actuator drive shaft 168 in the appropriate direction results in the reciprocating rectilinear motion, in the direction of the arrows 77, which brings the front bar 76 and the registration pins 78 thereon toward and away from registration engagement with the backbar 70. Suitable for use as the actuator 170 is a device manufactured by Ex-Cello Corp. and sold under model number S-1251-V. A locating magnet 176 is mounted to the push bar 156 and cooperates with a Hall Effect sensor 178 mounted on a bracket 180 connected to the side plate 23S to provide signals PIN IN and PIN OUT on lines 182 and 184, respectively. These signals are used by the control network. Suitable for use as the sensor 178 is a device manufactured by Microswitch Inc. and sold under model number 413SR10 while the magnet 176 is available for the same company under model number 101MG7.

As seen from FIGS. 4 and 7, the rod 148 is supported by front and rear bearing assemblies 186 and 188, respectively, disposed within a bearing housing 190. The bearing housing 190 is flexibly connected to the plate 172 through a flat spring 192 (FIGS. 7 and 8) by bolts 194 and 196. A brace plate 198 is secured between the bearing housings 190 at each end of the apparatus by bolts 202 (FIG. 8). Due to the flexible coupling afforded by the springs 136 and 138 (FIG. 5A) and the flat springs 192, it may be appreciated that front bar 76 may deflect upwardly and downwardly in the planes of FIG. 5 and laterally in the plane of FIGS. 4 and 5 to permit registering engagement with the backbar 70.

The clamp arrangement 32 (believed best seen in FIGS. 4 and 6) includes a clamp bar 208 having openings 210 disposed near each end thereof. The openings 210 are spaced apart on the clamp bar 208 at the same spacing as the locating pins 72 on the backbar 70. Thus, the clamp bar 208 may be mounted onto the locating pins 72 and are movable thereon with respect to the backbar 70. The fingers 214 extend rearwardly through the clamp access apertures 114 in the backbar 70. The clamp fingers 214 are notched, as at 215 (FIG. 6), so as to engage the clamp bar 208. The portion of the clamp fingers 214 disposed behind the backbar 70 have a notch 217 sized to receive a post 218. The post 218 is connected to one leg of an L-shaped crank 220 which is pivotally mounted to the clamp support bracket 110 by a pin 222. The other end of one of the L-shaped cranks 220 (shown in FIG. 4A) is pivotally attached, as at 224, to a piston rod 228 of an activating cylinder 230. The other end of the other of the cranks 220 (shown in FIG. 4B) is connected, as at 225, to a clevis 231 which is attached to the cylinder 230. Both the rod 228 and the cylinder 230 are movable in the direction of arrows 232 with respect to the machine frame 23 to reciprocate the clamp bar 208 toward and away from the backbar 70.

The lower end of clamp bar 208 has a flange portion 236 thereon (FIG. 6). A bore 238 extends through the flange 236 in alignment with the bore 90 extending through the flange 86. A portion of the flange is rounded, as at 240, to conform to the periphery of the rolls used in the laminating arrangement 38. Movement of the clamp bar 208 toward the backbar 70 serves to exert a clamping force acting in the direction of the arrow 242 (FIG. 6) tending to securely grip a circuit board and photomasks registered therewith between the clamp bar 208 and the backbar 70. Suitable for use as the actuating cylinder 230 is a double-acting pneumatic cylinder such as that manufactured by Bimba Mfg. Co. and sold under model number 09-DX. Pneumatic pressure is introduced into the cyliner 230 by appropriate fluid lines 246 in response to a suitable signal from the control network 48.

In the assembled relationship shown in the Figures, the photomask carrier assembly 50 (FIG. 3) is mounted to the backbar 70 with the locating pins 72 on the backbar extending through the registration holes 54 and the clamp fingers 214 extending through the openings 55 in the carrier assembly 50. The clamp bar 208 may be loosely mounted onto the same pins 72 and clamp fingers 214 outwardly of the carrier assembly 50 to thereby sandwich the carrier and photomasks between the backbar 70 and the clamp bar 208.

The board displacing arrangement 36 (FIGS. 4, 5 and 7) includes a carriage 252 connected to each end of the backbar 70 by bolts 254. The lower rear surface 256 of the carriage 252 is rounded (FIG. 7) as at 256 to conform to the rolls in the laminating arrangement 38. The bolts 254 also engage a timing belt 258 to secure the backbar 70 to the belt 258. The belt 258 is trained over an upper pulley 260 (FIG. 1) disposed above the exposure unit 28 and a lower drive pulley 262. The carriage 252 has follower rollers 266 (FIGS. 4 and 7) extending sidewise therefrom. The rollers 266 are captured in tracks 268 supported from the sideplates 23S. The tracks 268 are inclined at a slight angle to the vertical but may be characterized as being in a substantially upright orientation.

The upper pulley 260 (FIG. 1) is secured to a shaft 272 which is rotationally mounted on suitable bearings 269 between the two hollow upstanding support posts 23P secured to the framework 23. The lower pulley 262 is secured to a shaft 278 (also seen in FIGS. 9 and 10) which is supported for rotational movement by bearings 280 mounted to the sideplates 23S. The sideplates 23S are supported on brackets 23B from the posts 23P. The shaft 278 is driven by a reversible electric motor 282 mounted on the bracket 23B. The motor 282 is connected by a belt 284 in a driving relationship with a pulley 286 (also seen in FIGS. 9 and 10) connected to the shaft 278. Position signals for use by the control network are provided from a board displacement position encoder 288 (FIG. 2) connected to the drive motor 282. Board position signals are carried on lines 290A, 290B, 290C and 290D. Suitable for use as the encoder 288 is a device sold under model number IMI-205-41-0 by International Micro Industries, Cherry Hill, N.J.

The board displacing arrangement 36 hereinabove described is operative to vertically displace the backbar 70, the photomask carrier assembly 50 and the clamp arrangement 32 mounted thereon to various locations with respect to the frame 23. In one position the clamp bar 208 is made accessible to an operator and may be removed, enabling the operator to effect replacement of the photomask carrier assembly. This position is indicated by a signal on the line 290D. In another position, the board registration position corresponding to a signal on the line 290B, the circuit board is registered to the photomasks in a manner to be described. Thereafter, the board displacing arrangement 36 is operative to move the registered and clamped board and photomasks through the board laminating arrangement from which the registered and clamped board and photomasks are displaced to a board exposure position corresponding to a signal on the line 290C. The board, after exposure, is lowered below the registration position to a position corresponding to a signal on the line 290A during which motion the exposed board is returned to the board transfer arrangement 46.

With reference to FIGS. 9 and 10, respectively shown is a plan view and a front elevation of the laminating arrangement 38 used in the circuit board exposure apparatus of the present invention. The laminating arrangement comprises a front and a rear laminating roll 302 and 304, respectively, mounted on associated shafts 308 and 310. Each of the rolls 302 and 304 is coated with one-eighth inch thick neoprene rubber, 90 Shore A durometer. Each roll is mounted for rotational movement with respect to its associated drive shaft on bearings 312 and 314, respectively.

As seen from FIGS. 9 and 10 the drive shaft 310 for the rear roll 304 extends outwardly past the end of the roll through aligned bores 318 and 324 respectively provided in a first link member 320 and a coupling member 326. The shaft 310 is connected for rotation with a driven pulley 332 (FIG. 9) outwardly from one of the coupling member 326. Bearings 334 and 336 are respectively provided to line the aligned bores 318 and 324 to permit rotational movement of the shaft 310 with rspect to the first link 320 and the coupling 326.

The driven pulley 332 is connected by a timing belt 346 with a drive pulley 348 (FIG. 10) connected to the shaft 278. The shaft 278 extends inwardly of the apparatus 20 past the drive pulley 348 and through a bore 350 provided in the coupling member 326. A bearing 352 is disposed within the bore 350 to permit pivotal motion of the coupling member 326 with respect to the shaft 278.

The first link member 320 has a bore 360 (FIG. 9) which aligns with a bore 366 formed in a second link member 364. A pivot pin 370 projects through the aligned bores 360 and 366 to define a pivotally articulable connection between the link members 320 and 364. The bores 360, 366, and 370 are provided with suitable bearings. The second link member 364 is itself pivotally mounted with respect to the side plates 23S on pivot pins 371 supported in bores 372 and 374 in the side plates 23S and second link, respectively.

The pivot pin 370 is pivotally connected to the end of a piston rod 376 of a pneumatic actuator 382 mounted to the frame 23. The actuator 382 is controlled by a signal from the control network 48 on a line 386. Suitable for use as the actuator 382 is a device manufactured by Bimba Mfg. Co. and sold under model number 09-DX.

A bore 390 extends through the first link member 320 substantially intermediate the bores 318 and 360. A spring loader roller 392 is mounted within the bore 390, the roller 392 abutting against the rear roll 304. The force exerted by the roller 392 against the roll 304 is controlled by a spring 396. The two bar linkage formed from the links 320 and 364 is constrained so it cannot pass through center by a stop 397 (FIG. 7) suitably connected to the frame 23 in any convenient location.

As seen from FIGS. 5A and 9 the drive shaft 308 extends past the ends of the front roll 302 through a bore 402 provided at one end of one arm of an L-shaped coupling member 406. A bearing 410 lines the bore 402 to permit the shaft 308 to rotate with respect to the coupling 406. The bearing 410 has an annular protrusion 414 thereon to permit the roll 302 to align itself parallel to the roll 304 without deflecting the shaft 308 in the event of any misalignment of the axis of the roll 304 and the bores 402.

A driven pulley 420 is connected to the shaft 308 outwardly of the coupling 406. A timing belt 424 connects the pulley 420 to a drive pulley 428 (FIG. 5A). The drive pulley 428 is fixed to a shaft 432 which is mounted for rotation with respect to the side plate 23S by a bearing 436. The shaft 432 extends into a bore 438 provided at the joint of the arms of the coupling 406. The bore 438 is lined with a bearing 442 to permit the coupling 406 to pivot about the shaft 432. As seen in FIG. 9, the end of the other arm of the L-shaped coupling 406 has a bore 448 extending therethrough. The bore 448 is lined with a bushing 450 which receives a bar 454. The bushing 450 has a protrusion 456, similar to the protrusion 414. An actuator 458 (FIG. 7), similar to the actuator 382 is connected midway along the bar 454. The actuator 458 responds to the signal (OPEN ROLLS) output on the line 386 from the control network to open the rolls 302 and 304. A Hall Effect sensor 459 (FIG. 9) similar to the sensor 178 (FIG. 4A) is mounted on a suitable bracket attached to the frame 23 and a magnet 460 (similar to the magnet 176 (FIG. 4A) is mounted to the coupling member 406. The sensor 459 and magnet 460 are operative to provide signals on lines 462 and 463 respectively representative of the rolls being in the open and closed positions.

A drive gear 464 (FIG. 10) is connected for rotation with the shaft 278. A driven gear 468 is fixed to the shaft 432 for rotation therewith. The drive gear 464 is intermeshed with the driven gear 468. As seen in FIGS. 6, 7 and 10, a transmitter 476T and a receiver 476R are conveniently mounted to the frame and are arranged to communicate along a ray path 477 (through appropriately located apertures in the backbar, clamp and front bars). When a board B interdicts the ray path 477 defined between the transmitter and receiver a signal BOARD IN POSITION is output on a line 478 to the electrical control network. Suitable for use as the transmitter is a device sold by Banner Controls Inc. under model number RT400B while the receiver is available from the same company under number LR400.

The drive train for the laminating arrangement 38 may be traced with reference to FIGS. 1, 5A, 9 and 10. Rotation of the shaft 278 by the motor 282 rotates the pulley 262 and, therefore, the pulley 348 (FIG. 10) at the same angular velocity as the pulley 262. The pulley 348, through the belt 346, drives the pulley 332. In turn, the shaft 310, connected to the pulley 332, rotates therewith since the pulleys 332 and 348 have identical pitch diameters. In this manner the rear shaft 310 exhibits the same angular velocity as the pulley 262. By making the pitch diameter of the pulley 262 equal to the outside diameter of the roll 304, the surface speed of the roll 304 equals the linear speed of the backbar 70 as it is raised by the board displacing arrangement 36. However, since the roll 304 rides on the bearings 314, any slippage between the roll 304 and the shaft 310 may be accommodated.

In the case of the roll 302, rotation of the shaft 278 rotates the drive gear 464 therewith. The drive gear 464 engages the driven gear 468 which rotates the shaft 432. The gears 464 and 468 have equal teeth. The shaft 432 drives the pulley 428, which through the belt 424 rotates the pulley 420. The pulleys 420 and 428 have identical pitch diameters. Rotation of the pulley 420 thus turns the shaft 308 at the same angular velocity as the shaft 310 and the pulley 262. By making the outside diameter of the roll 302 equal to that of the roll 302 the front wall 302 runs at the same surface speed as the roll 304. Again, due to the provision of the bearings 312, slippage between the roll 302 and its associated shaft 308 may be accommodated.

The rolls 302 and 304 may be opened and closed in the following manner. To open the rolls to the position shown in FIG. 7 an actuating force is applied on the line 386 to the actuator 382 (FIG. 9) connected to the first link member 320 and to the actuator 458 mounted to the bar 454 (FIG. 9). The actuators respond by imposing forces in the directions of arrows 474 (FIG. 7) respectively drawing apart the rolls 302 and 304. The front roll 302 is retracted by the pivotal action of the L-shaped coupling 406 about the shaft 432. The rear roll 304 is retracted by the flexing of the two-bar linkage formed of the members 320 and 364. This flexure causes the shaft 310 to be drawn rearwardly with the coupling 326 pivoting on the shaft 278 to accommodate this movement. Imposition of forces in directions opposite to the arrows 474 restores the rolls 302 and 304 to the closed position. The great mechanical advantage of the two bar linkage insures that the roll 304 always closes to a fixed position with the linkage fully extended. The roll 302 will close to a varying position to accommodate various board thicknesses. Thus, the roll 304 forms a fixed datum in the closed position.

The registration and lamination of a circuit board character B may now be understood. Prior to board registration, the board B is lifted upwardly through the open rolls 302 and 304 (shown in FIG. 7) by the board transfer arrangement 46 to be described. The board B is lifted between the photomasks 58 depending from the photomask carrier bar 52. The photomask carrier bar 52 is previously mounted to the locating pins 72 on the backbar 70, and the clamp bar 208 has been set in place. These events have occurred in the photomask replacement position, as earlier discussed. The displacing arrangement 36 moves the backbar, photomask carrier and clamp bar to the registration position.

When the upper edge of the board B is generally in the vicinity of the registration position, as detected by the transmitter/receiver arrangement 476, its upward motion is halted. The front bar 76, having the registration pins 78 thereon, is moved toward the backbar 70 and clamp bar 208 in the direction 77 by the action of the actuator 170 (FIGS. 4A and 4B). As the front bar 76 moves toward the backbar 70 and the clamp bar 208, the locating pin 72 on the backbar enters the locating openings 82 provided in the front bar 76 whereby a precise alignment is accomplished. Substantially simultaneously with this occurrence the registration pins 78 sequentially (1) enter the openings 238 (in the flange 236 on the clamp bar 208), (2) the apertures 62 in the front photomask 58, (3) the registration apertures A provided in the board B, (4) the apertures 62, (5) the rear photomask 58, and (6) the openings 90 in the flange 86 on the backbar 70. It is noted that of all of the above listed apertures only those in the board B precisely match the pins 78. All other apertures are slightly oversize. The insertion of the locating pins 72 into the locating openings 82 in the front bar 76 serves to place the front and backbars in precise registration. The insertion of the registration pins 78 with the board brings the board in register (FIG. 7). In this manner the board B is precisely registered between the photomasks carried on the carrier assembly. It is preferred that when the board is lifted into the registration position it is placed such that the board rides up on the beveled end of the registration pins 78 as these pins enter the board, thus lifting the board B free of the transfer arrangement during the registration process.

With the board and photomasks registered, the clamp fingers 214 are activated by the actuator 230 thus securely gripping the registered board and photomasks. The front bar 76 is then retracted to the initial position and the clamped and registered board and photomasks lowered to the laminating position by the board displacement arrangement 36. When the clamped and registered board and masks reach the laminating position, the nip rolls 302 and 304 are closed in the manner discussed. The surface of the rolls is received by the rounded portions 88 and 240 provided in the flange 86 on the backbar 70 and the flange 236 on the clamp bar 208, respectively. The board displacement arrangement 36 is actuated, lifting the clamped board and photomasks from the laminating to the exposure position. As discussed earlier, the surface speed of the laminating rolls 302 and 304 matches the speed at which the clamped and registered board and photomasks are displaced.

As the board B and photomasks are laminated, water is applied to both surfaces of the board by the applicator arrangement 40. The applicator arrangement 40 comprises two closed ended, hollow tubes 480A and 480B of circular cross section mounted to the sideplates 23S of the framework 23. The tubes 480 are aligned with their axes parallel to the axis of the shaft 310 and arranged to lie directly beneath the rolls 308 and 310, respectively. The tubes 480 extend the full length of the rolls 308 and 310. An array of fine holes 482 (preferably approximately 0.020 inch diameter) are drilled at predetermined spacings (approximately 0.25 inch) into each of the tubes 480 in a line parallel to the tube axis. The tubes 480 are installed such that the hole array in the tube 480A is directed toward the roll 304 while the array of holes in the tube 480B is directed toward the roll 302. With this orientation water sprayed from these arrays impinges on both photomasks 58 and/or both sides of the board B. The trough 41 is arranged to catch liquid dripping from either of the rolls 308 and 310. The trough 41 is provided with an aperture 484 through which the board B passes. A second trough 41' (FIG. 2) is disposed beneath the conveyor arrangement 46 to trap liquid passing through the aperture 484.

Liquid is circulated by a pump 486 through a filter 488 (typically one micron) and is carried through any suitable conduits to the spray tubes 480. Additional water may occasionally be added as necessary.

Figure 12:
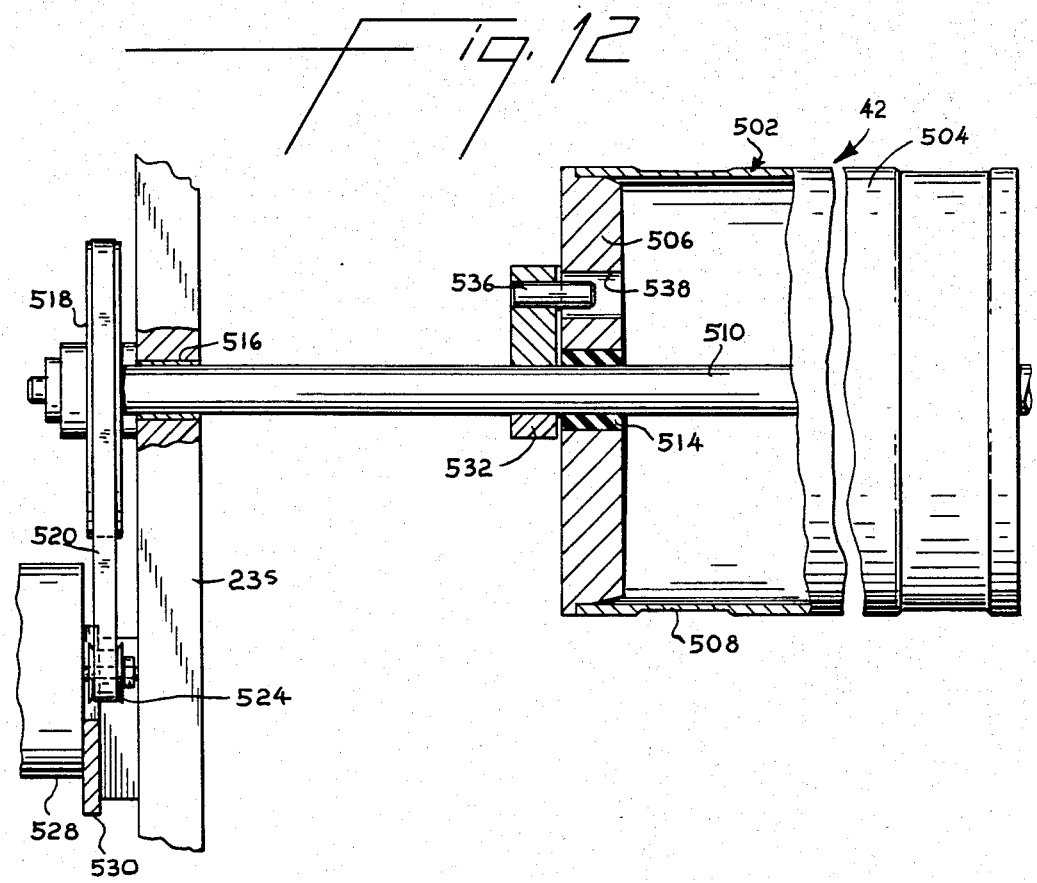
FIG. 12 is a side elevation view of a photomask take-up roll used in the circuit board exposure apparatus of the present invention.

The ends of the photomasks 58 opposite their attachment to the photomask carrier bar 52 are connected to the photomask take-up arrangement 42. A side elevation view of one of the take-up rolls 502 used in take-up arrangement 42 is shown in FIG. 12. It is to be understood that a similar roll 502 is used for each photomask. The rolls 502 are mounted in any convenient location on the side frame 23S. The roll 502 includes a tubular portion 504 closed at each end by a cover plate 506. The roll 502 is mounted to a shaft 510 extending centrally and axially therethrough. The shaft is supported in each cover plate 506 by an elastomeric bearing 514 which permits the take-up roll 502 to deflect to accommodate any forces imposed thereon. The ends of the shaft 510 are supported by bushings 516 (only one of which is shown in FIG. 12) which line openings provided in the side plates 23S. One end of the shaft 510 is connected to a pulley 518 which is driven by a timing belt 520 from a pulley 524 connected to a suitable drive motor 528. The motor 528 is mounted on a suitable bracket 530 supported by the side plate 23S. Motive energy is transmitted to the roll 502 by a crank 532 affixed to the shaft 510. The crank 532 carries a pin 536 which engages an opening 538 provided in the cover plate 506. The take-up rolls 502 are driven in a direction and at a speed compatible with the movement of the board displacing arrangement to either take-up or let-out (as the case may be) the photomasks as the photomasks move with the board to which they are registered and clamped. Suitable for use as the motor 528 is a device manufactured by Bodine and sold under model number NCI-35.

The exposure unit 28 (FIGS. 1 and 2) contains sources operative to provide actinic radiation to the surface of the board through the photomasks registered therewith while the board and photomasks are in the exposure position. In the preferred case, the exposure unit 28 includes a front and a rear half 540A and 540B (FIG. 2) which are pivotally mounted on posts 541 (FIG. 1) projecting from the frame posts 23P. Each half of the exposure unit 28 preferably contains an array of fluorescent lamps indicated by the character 542 each of which emit substantial amounts of radiation to which the photosensitive substrate on the board B is active. The halves of the exposure unit 28 are pivotally movable to provide access to the interior of the unit 28. Since the posts 23P are hollow, it is preferred that they serve as cooling fluid conduits to conduct a cooling fluid, as air, from blowers 543 conveniently mounted to the framework. The air from the interior of the post 23P passes through an opening surrounded by a collar 544 mounted to the posts 23P into the exposure unit 28. Suitable for use as the blower is a device manufactured by Rotron and sold under model number Vanguard VJ6016A52.

The board conveyor arrangement 44, shown in FIGS. 13A through 13C and FIG. 14, includes a lower support plate 602 mounted to the lower superstructure of the frame 23 in any convenient manner, as by brackets 604 and bolts 606. An upper support plate 608 is supported away from, but in parallel relation to, the lower support plate 602 by brace bars 610. The brace bars 610 are secured to the plates 602 and 608 by any suitable means of attachment, such as the bolts 612. The lower plate 602 is provided with cutouts 616 and 618 (FIGS. 13B and 13C) which permit operating clearance for the board transfer arrangement 46 to be discussed. An intermediate support plate 622 (FIG. 13C) is supported by brace bars 624 away from the region of the lower support plate 602 between the cutouts 616 and 618.

Conveyor drive rollers 630, 632, 634 and 636 are mounted to suitable drive shafts 642, 644, 646 and 648, respectively. The shafts are supported for rotation beneath the lower plate 602 by suitable brackets 652. Also suitably mounted for rotation at predetermined positions along the lower plate 602 are idler rollers 656 through 672. A conveyor belt 676 is trained around the conveyor drive rollers 630 and 632 and is supported by the idler rollers 656, 658, 660, 662 and 664. A second conveyor belt 680 is trained around the drive roller 634 and the idler rollers 666 and 668. A third conveyor belt 684 is trained over the drive roller 636 and the idler rollers 670 and 672. The belts 676, 680 and 684 each include a groove 686 (FIG. 13D) which is adapted to support the lower edge of a circuit board B as it is horizontally conveyed by the conveyor arrangement 44 toward the board transfer arrangement 46 to be described. Suitable at the belts 676, 680 and 684 are belts manufactured by Eagle Belting Co. and sold under model number 3L Sec "Twin".

The shaft 644 (FIG. 13B) carries a pulley 690 which is connected by a belt 694 to a pulley 698 (not visible in FIG. 13C) mounted to the shaft 646 (FIG. 13C). The shaft 646 also carries a second pulley 702 forwardly of the pulley 698 (not shown). The pulley 702 is connected by a belt 706 to a pulley 710 mounted to the shaft 648. The shaft 642 (FIG. 14) carries a pulley 716 which is connected by a belt 720 to the output shaft of a brake/clutch mechanism 724 (FIG. 14) that is mounted to the framework 23. The brake/clutch mechanism is operatively associated with a horizontal conveyor drive motor 728 also mounted to the framework 23. Suitable for use as the motor 728 is a device manufactured by Bodine and sold under model number 44D581PM, while the brake/clutch mechanism 724 may be that sold by Warner Company under model number Mod. Size EP-250. A shaft encoder 730, such as that sold by Opto Technology, Inc. under model number OTS0251 is connected to the shaft from the brake/clutch 724. Output signals on a line 732 are provided from the encoder 730 to the control network and serve as an indication of the horizontal speed of a board B carried by the conveyor arrangement 44. Motor control signals CONVEYOR MOTOR ON on a line 732 and CONVEYOR MOTOR DIRECTION on a line 734 are applied to the motor 728 from the control network. In addition, a clutch control signal HORZ. CLUTCH is applied on a line 740 to the clutch 724. The clutch/brake 724 is arranged such that if the clutch is not engaged, the brake is automatically asserted.

The drive train for the lower conveyor belts 676, 680 and 684 may now be understood. Motive energy from the motor 728 is applied (when the clutch 724 is engaged) to the pulley 716 to rotate the drive pulley 630. The pulley 630 through the conveyor belt 676 drives the shaft 644 for the roller 632, which in turn drives the shaft 646 for the roller 634 through the pulley 690, the belt 694 and the pulley 698. The shaft 646 also drives the pulley 702, which through the belt 706 and the pulley 710 drives the shaft 648 for the roller 636.

Each of the shafts 642, 644, 646 and 648 carries a bevel drive gear 744 (FIG. 14) which is mated with a bevel driven gear 746 (FIG. 14) carried by each of shafts 748, 750, 752 and 754. Each of these last-mentioned shafts are mounted at their lower ends for rotation with respect to the lower plate 602. The shafts 748, 750 and 754 are mounted at their upper ends for rotation with respect to the upper plate 608. The upper end of the shaft 752 is mounted for rotation with respect to the intermediate support plate 622. Idler shafts 756 and 758 (FIGS. 13A and 13B, respectively) are also mounted for rotation between the plates 602 and 608.

Pulleys 760, 762 and 764, 766 and 768 are respectively connected to the shafts 748, 756, 758, 750 and 754 for rotation therewith. A belt 772 is trained over the pulleys 760, 762 and 764. A belt 774 is trained over the pulleys 766 and 768. As seen in FIG. 13E, the belts 772 and 774 include a pointed edge 778 which is arranged to touch against the upper margin of the circuit board B as it is carried along by the horizontal conveyor arrangement 44. Suitable for use as the belts 772 and 774 are belts manufactured by Eagle Belting Co. and sold under model number A: "Hi-Ridge-Top". The shaft 750 also carries a roller 780 having a rim which defines a peripheral edge 782. A similar roller 784 which defines a peripheral edge 786 mounted to the shaft 752. The edges 782 and 786 abut against the board B substantially midway along its height, but do not affect the photosensitive layer on the board.

An input sensor arrangement, comprised of a transmitter 788T and a receiver 788R output a signal BOARD INPUT on a line 790 to the control network. A centering sensor arrangement comprising a transmitter 792T and receiver 792R is mounted on the vertical centerline VCL of the apparatus. A signal, BOARD CENTERED is applied from the receiver 792R to the control network on a line 794.

Figure 15:
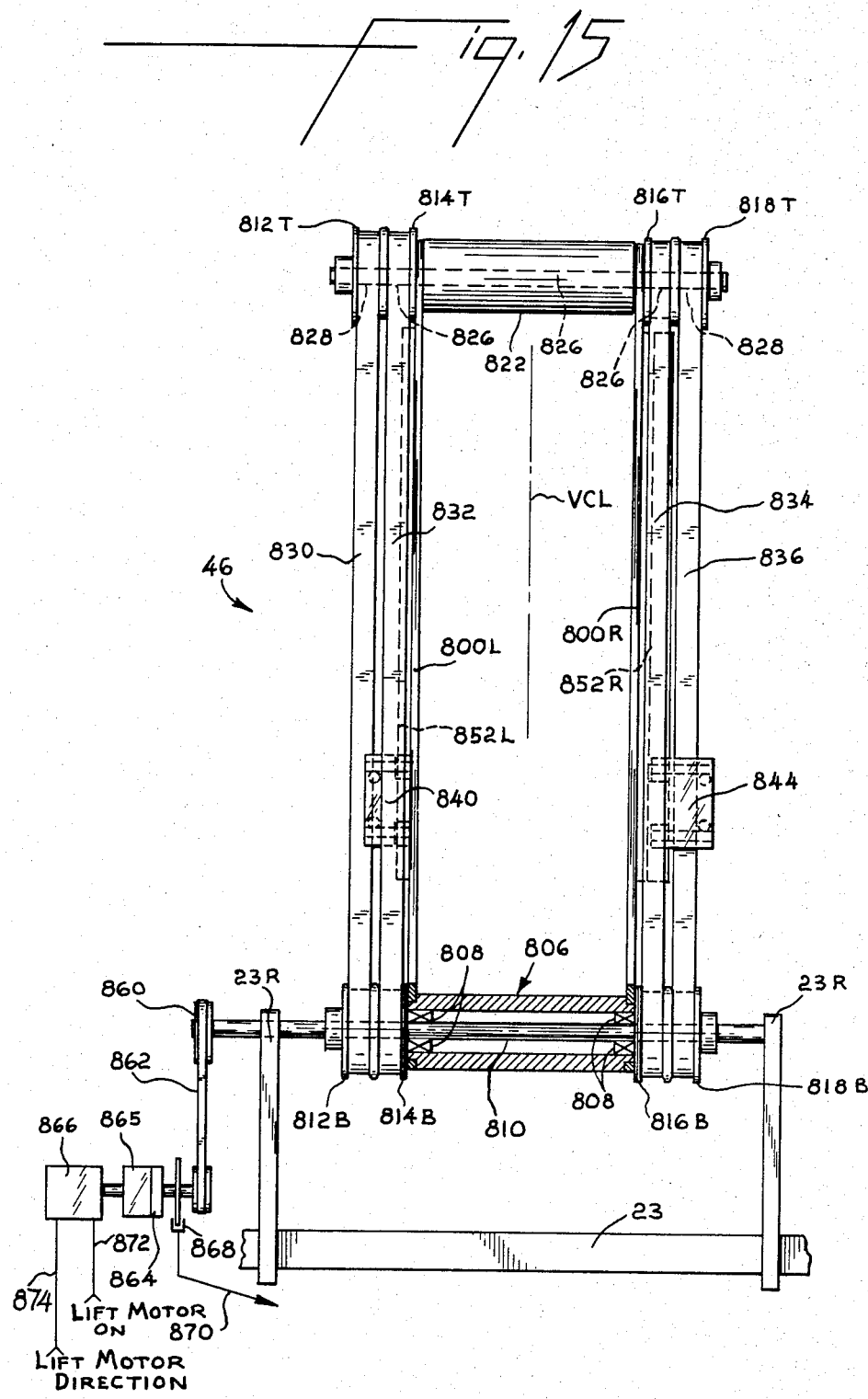
FIG. 15 is a front elevation view of a board transfer arrangement used in the circuit board exposure apparatus of the present invention.
Figure 16:
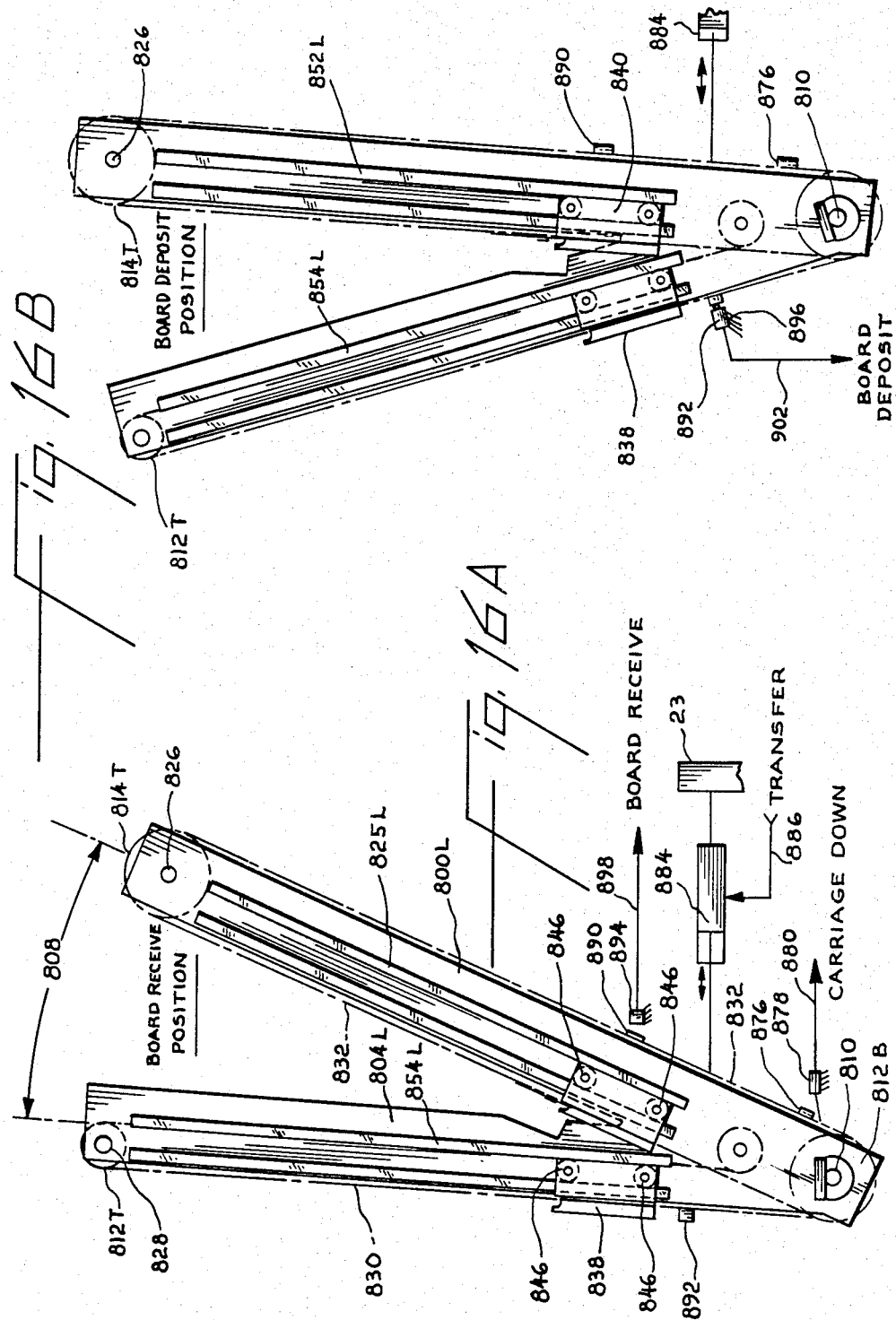
FIGS. 16A and 16B are side elevation views of the board transfer arrangement shown in FIG. 15 in the board receive and board deposit positions, respectively.

The board transfer arrangement 46 is shown in FIGS. 15 and 16. The transfer arrangement 46 includes a pair of board lifting arms 800L and 800R disposed on opposite sides of the vertical centerline VCL and a pair of board lowering arms 804L and 804R respectively corresponding to the arms 780. (The arm 804R is not visible in the Figures) the lower ends of each of these four arms are secured to the periphery of a tube 806 such that the angular spacing 808 (FIG. 16) between the axes of the corresponding arms 800L and 804L or 800R and 804R remains fixed. The tube 806 is rotationally mounted on suitable bearings 808 to a shaft 810. The shaft 810 is itself rotationally mounted with respect to mounting plates 23R affixed to the frame 23.

Mounted for rotation with the shaft 810 laterally outwardly of the arms 800 and 804 are bottom pulleys 812B, 814B, 816B and 818B. The upper ends of the arms in each pair of arms 800 and 804 are connected by a tubular member 822 and 824 respectively. (The member 824 is not visible in the drawings.) A shaft 826 and 828 is mounted for rotation within the tubes 822 and 824, respectively. Top pulleys 814T and 816T are mounted to opposite ends of the shaft 826 for rotation therewith. Similarly, top pulleys 812T and 818T are mounted for rotation with opposed ends of the shaft 828. The corresponding top and bottom pulley are interconnected by belts 830, 832, 834 and 836 respectively. Secured to each of the belts at corresponding heights thereon is a board lifting carriage 838, 840, 842 and 844, respectively. (The carriages 838 and 842 are not shown in FIG. 15 for clarity of illustration.) Each of the carriages are provided with followers 846. The carriages 840 and 842 respectively ride along tracks 852L and 852R secured to the outside surfaces of the arms 800. The followers on the carriages 838 and 844 respectively ride in tracks 854L and 854R secured to the outside of the arms 804. The tracks 854 are built-up in order to permit the carriaes 838 and 844 to ride outboard of the carriages 840 and 842. Each carriage is provided with fingers 858 adapted to engage the lower edge of a circuit board B.

The shaft 810 is connected to a pulley 860 which is, in turn, connected by a belt 862 to the output shaft of a brake/clutch mechanism 864 similar to the brake/clutch mechanism 724. The brake/clutch mechanism is connected to a driver motor 866, similar to the motor 728. A shaft encoder 868, similar to the encoder 730, is mounted to the output shaft from the brake/clutch 864. Signals representative of the location of the carriages with respect to their arms are output from the encoder 868 to the control network on a line 870. Motor control signals LIFT MOTOR ON and LIFT MOTOR DIRECTION are carried on lines 872 and 874 respectively from the control network. The clutch 864 receives a signal VERTICAL CLUTCH on a line 865 from the control network.

When the motor 866 is energized and the clutch enabled, the carriages 838, 840, 842 and 844 move together upwardly and downwardly (depending upon motor direction). As seen from FIG. 16, the drive belt 832 for the carriage 840 carries a member 876 which cooperates with a limit switch 878 to generate a CARRIAGE DOWN position signal output on a line 880 to the control network. Suitable for use as the limit switch 878 is a device solid by Opto Technology, Inc. under moldel number OTS-251.

The arms 800 and 804 are movable from the board receiving position (shown in FIG. 16A) to a board deposit position (shown in FIG. 16B) by an actuator 884 connected between one of the arms 800 and the frame 23. Suitable for use as the actuator is a device manufactured by Bimba and sold under model number 09-DX. The actuator 884 is controlled by an output signal carried on a line 886 from the control network to displace the mechanism to the deposit position wherein the exposed board may be carried away by any suitable means.

One of each pair of the arms 800 and 804 carries a magnet 890 and 892, respectively. Sensors 894 and 896 are mounted to the frame 23 in appropriate positions to respectively provide a BOARD RECEIVE position signal on a line 898 and BOARD DEPOSIT position signal on a line 902 representative of the transfer arrangement occupying the receive and deposit positions, respectively. These sensors arrangements are similar to the magnet 176 and the sensor 178 (FIG. 4A).

Figure 17:
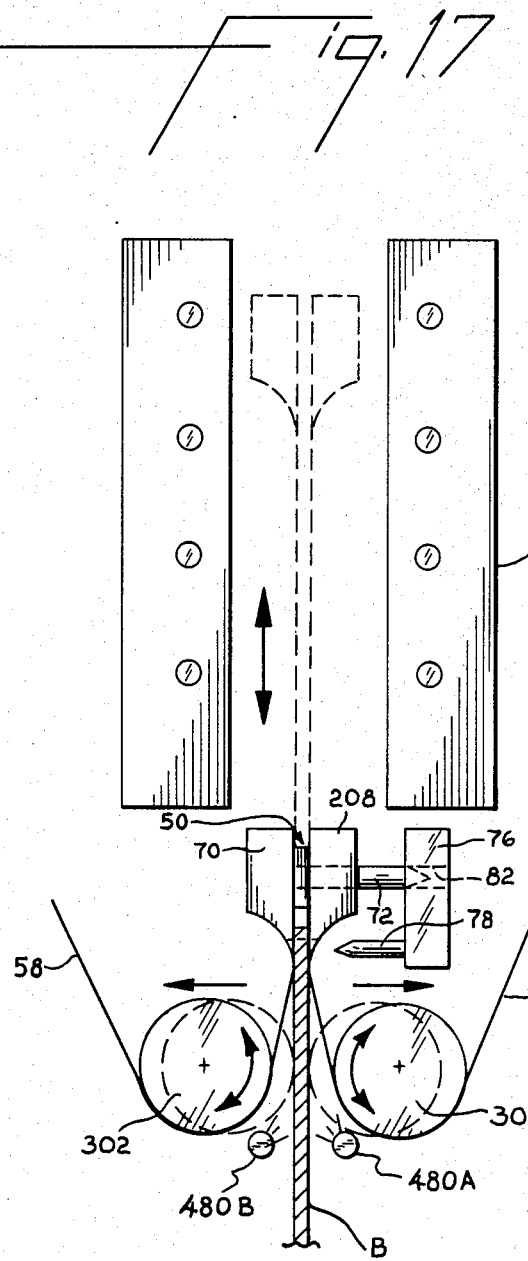
FIG. 17 is a stylized schematic representation of the circuit board exposure apparatus of the present invention.

FIG. 17 is a highly stylized pictorial representation of the board exposure apparatus 20 from which an understanding of the operation of the present invention may be obtained. In the following discussion, the following initial conditions are assumed extant:

a photomask carrier 50 (FIG. 3) is mounted onto the locating pins 72 projecting from the backbar 70;

the clamp bar 208 is open;

the exposure unit 28 is in a standby condition;

the front bar 76 carrying the registration pins 78 is disengaged from backbar 70;

the laminating rolls 302 and 304 are open;

the applicator arrangement is operative to direct a spray of liquid toward the path of the circuit board;

transfer arrangement 46 is in the board receiving position (FIG. 16) with the carriages occupying their lower positions with respect to lifting arms 800 and lowering arms 804; and the board conveyor arrangement 44 is operative.

The first unexposed circuit board B having laminated photosensitive polymer layers on each side thereof and at least two pin registration apertures A therein is conveyed by the board conveyor arrangement 44 into a position intermediate the pair of the lifting and lowering arms of the board transfer arrangement 46. As the board B is conveyed along the conveyor arrangement 44 its length is measured by the action of the sensors 788. The board B is centered with respect to the lifting arms 800 by the action of the centering sensor 792. Once centered, the board conveyor 44 is stopped and the board transfer arrangement 46 is pivoted to the board deposit position. During the movement of the board transfer means the unexposed circuit board is picked up by the carriages on the lifting arms 800.

With the transfer arrangement 46 in the board deposit position the lifting arms thereof are disposed substantially vertically beneath the board registration arrangement. The carriages on the lifting arms 800 are activated lifting the board thereon upwardly through the open laminating rolls 302 and 304. When the upper edge of the unexposed board is in proximity to the registering arrangement the lifting thereof is halted by operation of the board position sensor 476. The position of the carriages with respect to the arms is stored for later use. With the upper edge of the board proximal to the registering means, the front bar 76 having the registration pins 78 thereon moves in the direction of arrow 77 toward the backbar 70. The motion of the front bar 78 places the locating pins 72 into the openings 82 provided in the front bar 70. Substantially simultaneously with this occurrence the registration pins 78 on the front bar enter the apertures 238 and 90 provided in the clamp bar 208 and the backbar 70 respectively and through the registration apertures provided in the photomasks 58 and the circuit board B. When the registration pins 78 have fully engaged and registered the board B with respect to the photomasks 58. The clamp arrangement 32 is thereupon activated, firmly gripping the registered board and photomasks between the clamp part 208 and the backbar 70. The front bar 76 is returned to its initial position and the carriages on the lifting and lowering arms are returned to their lower position.

The board displacing arrangement 36 is activated to lower the now-clamped and registered board and photomasks to the laminating position where the lower contoured radii of the backbar 70 and the clamp bar 208 are in a position to abut against the rolls 302 and 304, respectively of the laminating arrangement 38. Upon reaching this position, the laminating rolls close. Upon reaching the position, the laminating rolls close. The board displacing arrangement 36 is again activated to lift the board and the photomasks 58 registered thereto from the laminating position toward the exposure position. As the board is displaced through the now-closed laminating rolls, the photomasks 58 are laminated to the surface of the board B. Intimate contact between the photomasks and each surface of the board B is achieved by the action of the laminating rolls 302 and 304 squeezing excess liquid from between the board and the photomasks as the board B is displaced therepast. When the board and the photomasks registered thereto are in the exposure position, the exposure unit is activated to direct actinic radiation toward each surface of the board B through the photomask 58 laminated to each surface thereof. While the exposure occurred, the board transfer arrangement 46 is pivoted to the board-receiving position and the carriages on the lifting and lowering arms are raised to occupy a height therealong corresponding to stored position.

After exposure is complete the board displacing arrangement lowers the now-exposed board to the lamination position. The claim bar 208 and the laminating rolls 302 and 304 are opened permitting the now-exposed board to drop by gravity onto the carriages of the lowering arm. The carriages on the lowering arm are moved to the lower position while the board displacing arrangement moves the backbar and clamp bar assembly to the registration position in anticipation of the next board to be laminated.

The next successive unexposed board is conveyed by the conveyor to a position intermediate the arms of the board transfer arrangement and the process is repeated. It is noted that the movement of the board transfer arrangement from the board receiving to the board deposit position serves to dispose the succeeding unexposed board into position below the registration means and simultaneously deposit the exposed board onto a suitable carry-off conveyor.

We claim:

1. A substrate exposure apparatus comprising:
a framework:
means for registering a photomask with respect to substrate with a photosensitive layer;
optional means for displacing the registered substrate and photomask with respect to the framework to an exposure position;
means for exposing the photosensitive substrate;
a laminator means for laminating the photomask to the surface of the substrate with the photosensitive layer optionally as the substrate and the photomask are displaced to the exposure position including means for applying pressure to the substrate with a photosensitive layer and the photomask to allow contact through a liquid layer;
means for applying relative movement between (a) the substrate with the photosensitive layer and the photomask and (b) means for applying pressure; and
an applicator for applying a liquid positioned adjacent at least one of the surfaces of the photosensitive layer and the photomask whereby an excess of liquid can be obtained at a nip where the photosensitive layer and photomask contact one another through the liquid.

2. The substrate exposure apparatus of claim 1 wherein both the substrate and the photomask have a registration aperture therein; and wherein
the registering means comprises a front bar having a registration pin thereon, the front bar being displaceable with respect to the substrate and to the photomask to dispose the registration pin through the registration apertures in both the substrate and the photomask thereby to register the same.

3. The substrate exposure apparatus of claim 1 wherein both the substrate and the photomask or photomask carrier assembly have an aperture therein; and wherein the registering means comprises:
a backbar having a locating pin therein, the backbar being adapted to receive the photomask or photomask carrier assembly in a predetermined position thereon; and,
a front bar having a locating opening therein and a registration pin thereon, the front bar being displaceable with respect to the substrate, the photomask or photomask carrier assembly and the backbar to simultaneously dispose the locating pin on the backbar into the locating opening in the front bar and the registration pin on the front bar through the apertures in the substrate and the photomask or photomask carrier assembly thereby to register the same.

4. The substrate exposure apparatus of claim 1 further comprising:
clamp means for grasping the registered substrate and photomask to maintain them in register as they are displaced to the exposure position.

5. The substrate exposure apparatus of claim 2 further comprising:
clamp means from grasping the registered substrate and photomask to maintain them in a register as they are displaced to the exposure position.

6. The substrate exposure apparatus of claim 3 further comprising:
clamp means for grasping the registered substrate and photomask to maintain them in register as they are displaced to the exposure position.

7. The substrate exposure apparatus of claim 4 wherein the clamp means comprises:
a clamp bar mountable on and movable with respect to the backbar; and,
an actuator connected to the clamp bar for moving the same with respect to the backbar to exert a grasping force on the substrate and the photomask when the same are registered to grasp the substrate and photomask between the clamp bar and the backbar.

8. The substrate exposure apparatus of claim 1 wherein the applicator comprises a spray tube, the tube being arranged to direct a liquid spray toward the surface of the substrate onto which the photomask is laminated.

9. The substrate exposure apparatus of claim 1 further comprising:
an exposure unit mounted to the framework; and wherein
the framework is formed of a hollow member having an opening communicating with the interior of the exposure unit, the hollow member being adapted to conduct a cooling medium into a heat exchange relationship with the exposure unit thereby to cool the same.

10. The substrate exposure apparatus of claim 8 further comprising:
an exposure unit mounted to the framework; and wherein
the framework is formed of a hollow member having an opening communicating with the interior of the exposure unit, the hollow member being adapted to conduct a cooling medium into a heat exchange relationship with the exposure unit thereby to cool the same.

11. The substrate exposure apparatus of claim 2 further comprising:
a substrate conveyor for carrying unexposed substrates; and
a substrate transfer arrangement disposed beneath the registering means, the transfer arrangement having a substrate lifting arm and a substrate lowering arm, each arm having a carriage thereon, the transfer arrangement being movable with respect to the framework from a substrate receiving position in which the lifting arm is aligned with the conveyor and the lowering arm is disposed directly beneath the registering means to a substrate deposit position in which the lifting arm is disposed directly beneath the registering means,
the transfer arrangement, while in the substrate receiving position, being adapted to accept an unexposed substrate from the conveyor onto the carriage on the lifting arm and to accept an exposed substrate onto the carriage on the lowering arm, and being further adapted upon movement with respect to the framework to the substrate deposit position to deposit the exposed substrate onto a predetermined location and to lift the unexposed substrate into proximity to the registering means.

12. The substrate exposure apparatus of claims 8 further comprising:
a substrate conveyor for carrying unexposed substrates; and
a substrate transfer arrangement disposed beneath the registering means, the transfer arrangement having a substrate lifting arm and a substrate lowering arm, each arm having a carriage thereon, the transfer arrangement being movable with respect to the framework from a substrate receiving position in which the lifting arm is aligned with the conveyor and the lowering arm is disposed directly beneath the registering means to a substrate deposit position in which the lifting arm is disposed directly beneath the registering means,
the transfer arrangement, while in the substrate receiving position, being adapted to accept an unexposed substrate from the conveyor onto the arriage on the lifting arm and to accept an exposed substrate onto the carriage on the lowering arm, and being further adapted upon movement with respect to the framework to the substrate deposit position to deposit the exposed substrate onto a predetermined location and to lift the unexposed substrate into proximity to the registering means.

13. The substrate exposure apparatus of claims 9 further comprising:
a substrate conveyor for carrying unexposed substrates; and
a substrate transfer arrangement disposed beneath the registering means, the transfer arrangement having a substrate lifting arm and a substrate lowering arm, each arm having a carriage thereon, the transfer arrangement being movable with respect to the framework from a substrate receiving position in which the lifting arm is aligned with the conveyor and the lowering arm is disposed directly beneath the registering means to a substrate deposit position in which the lifting arm is disposed directly beneath the registering means,
the transfer arrangement, while in the substrate receiving position, being adapted to accept an unexposed substrate from the conveyor onto the arriage on the lifting arm and to accept an exposed substrate onto the carriage on the lowering arm, and being further adapted upon movement with respect to the framework to the substrate deposit position to deposit the exposed substrate onto a predetermined location and to lift the unexposed substrate into proximity to the registering means.

14. A substrate exposure apparatus comprising:
a framework;
a registration arrangement for registering each surface of a substantially upright substrate with a photomask while the substrate is in a registration position;
a substrate displacement arrangement for displacing the registered substrate and photomasks substantially vertically with respect to the framework from the registration position to an exposure position;
a clamp arrangement for grasping the registered substrate and photomasks to maintain the same in register as they are displaced to the exposure position;
an exposure unit operative to expose the clamped and registered substrate and photomasks to actinic radiation;
a laminating arrangement for laminating the photomasks to each surface of the substrate as the registered substrate and photomasks move to the exposure position whereby substantially no movement of the substrate relative to the photomasks occurs; and
an applicator for applying a liquid onto each surface of the substrate as the photomasks are laminated thereto.

15. The substrate exposure apparatus of claim 14 wherein
both the substrate and the photomasks have a registration aperture therein; and wherein
the registering means comprises a front bar having a registration pin thereon, the front bar being displaceable with respect to the substrate and to the photomasks to dispose the pin through the apertures in both the substrate and the photomasks thereby to register the same.

16. The substrate exposure apparatus of claim 14 wherein both the substrate and the photomasks or photomask carrier assembly have an aperture therein; and wherein the registering means comprises:

a backbar having a locating pin therein, the backbar being adapted to receive the photomasks or photomask carrier assembly in a predetermined position thereon; and, a front bar having a locating opening and a registration pin thereon, the front bar being displaceable with respect to the substrate, the photomasks or photomask carrier assembly, and the backbar to simultaneously dispose the locating pin on the backbar into the locating opening in the front bar and the registration pin on the front bar through the apertures in the substrate and the photomasks or photomask carrier assembly thereby to register the same.

17. The substrate exposure apparatus of claim 15 wherein the clamp arrangement comprises:

a clamp bar having a locating opening therein, the clamp bar being mountable on the backbar when the locating pin on the backbar is received through the locating opening in the clamp bar; and, an actuator for exerting a grasping force on the substrate and the photomasks when the same are registered to grasp the substrate and photomasks between the clamp bar and the backbar.

18. The substrate exposure apparatus of claim 16 wherein the clamp arrangement comprises:

a clamp bar mountable on the locating pin and movable with respect to the backbar;

a clamp finger connected to the clamp bar; and an actuator connected to the clamp finger to displace the same with respect to the backbar to move the clamp bar toward the backbar to exert a grasping force on the substrate and the photomasks when the same are registered to grasp the substrate and photomasks between the clamp bar and the backbar.

19. The substrate exposure apparatus of claim 15 wherein the applicator comprises a first and a second spray tube each having an array of holes therein, each tube being arranged to direct a liquid spray toward one surface of the substrate.

20. The substrate exposure apparatus of claim 15 wherein
an exposure unit is mounted to the framework and wherein
the framework is formed of a hollow member having an opening communicating with the interior of the exposure unit, the hollow member being adapted to conduct a cooling medium into a heat exchange relationship with the exposure unit thereby to cool the same.

21. The substrate exposure apparatus of claim 19 wherein an exposure unit is mounted to the framework; and wherein
the framework is formed of a hollow member having an opening communicating with the interior of the exposure unit, the hollow member being adapted to conduct a cooling medium into a heat exchange relationship with the exposure unit thereby to cool the same.

22. The substrate exposure apparatus of claim 15 further comprising:

a substrate conveyor for carrying unexposed substrates; and a substrate transfer arrangement disposed beneath the registering means, the transfer arrangement having a substrate lifting arm and a substrate lowering arm, each arm having a carriage thereon, the transfer arrangement being movable with respect to the framework from a substrate receiving position in which the lifting arm is aligned with the conveyor and the lowering arm is disposed directly beneath the registering means to a substrate deposit position in which the lifting arm is disposed directly beneath the registering means, the transfer arrangement, while in the substrate receiving position, being adapted to accept an unexposed substrate from the conveyor onto the arriage on the lifting arm and to accept an exposed substrate onto the carriage on the lowering arm, and being further adapted upon movement with respect to the framework to the substrate deposit position to deposit the exposed substrate onto a predetermined location and to lift the unexposed substrate into proximity to the registering means.

23. The substrate exposure apparatus of claim 19 further comprising:

a substrate conveyor for carrying unexposed substrates; and a substrate transfer arrangement disposed beneath the registering means, the transfer arrangement having a substrate lifting arm and a substrate lowering arm, each arm having a carriage thereon, the transfer arrangement being movable with respect to the framework from a substrate receiving position in which the lifting arm is aligned with the conveyor and the lowering arm is disposed directly beneath the registering means to a substrate deposit position in which the lifting arm is disposed directly beneath the registering means, the transfer arrangement, while in the substrate receiving position, being adapted to accept an unexposed substrate from the conveyor onto the arriage on the lifting arm and to accept an exposed substrate onto the carriage on the lowering arm, and being further adapted upon movement with respect to the framework to the substrate deposit position to deposit the exposed substrate onto a predetermined location and to lift the unexposed substrate into proximity to the registering means.

24. The substrate exposure apparatus of claim 20 further comprising:

a substrate conveyor for carrying unexposed substrates; and a substrate transfer arrangement disposed beneath the registering means, the transfer arrangement having a substrate lifting arm and a substrate lowering arm, each arm having a carriage thereon, the transfer arrangement being movable with respect to the framework from a substrate receiving position in which the lifting arm is aligned with the conveyor and the lowering arm is disposed directly beneath the registering means to a substrate deposit position in which the lifting arm is disposed directly beneath the registering means, the transfer arrangement, while in the substrate receiving position, being adapted to accept an unexposed substrate from the conveyor onto the carriage on the lifting arm and to accept an exposed substrate onto the carriage on the lowering arm, and being further adapted upon movement with respect to the framework to the substrate deposit position to deposit the exposed substrate onto a predetermined location and to lift the unexposed substrate into proximity to the registering means.

* * * * *